United States Patent
Eastep et al.

(10) Patent No.: US 6,281,023 B2
(45) Date of Patent: Aug. 28, 2001

(54) COMPLETELY ENCAPSULATED TOP ELECTRODE OF A FERROELECTRIC CAPACITOR USING A LEAD-ENHANCED ENCAPSULATION LAYER

(75) Inventors: Brian Lee Eastep; Thomas A. Evans, both of Colorado Springs, CO (US)

(73) Assignee: Ramtron International Corporation, Colorado Springs, CO (US)

( * ) Notice: Subject to any disclaimer, the term of this patent is extended or adjusted under 35 U.S.C. 154(b) by 0 days.

(21) Appl. No.: 09/759,128

(22) Filed: Jan. 11, 2001

Related U.S. Application Data

(60) Division of application No. 09/085,280, filed on May 27, 1998, now Pat. No. 6,211,542, which is a continuation-in-part of application No. 08/828,157, filed on Mar. 27, 1997, now Pat. No. 6,027,947, which is a continuation-in-part of application No. 08/728,740, filed on Oct. 10, 1996, now Pat. No. 5,864,932, which is a continuation-in-part of application No. 08/700,076, filed on Aug. 20, 1996, now Pat. No. 5,920,453.

(51) Int. Cl.[7] .................................................. H01L 21/00
(52) U.S. Cl. .............................. 438/3; 257/295; 257/532; 438/239; 438/381
(58) Field of Search ........................... 257/295, 296–313, 257/532, 535; 438/3, 239–256, 386–399; 361/311–324

(56) References Cited

U.S. PATENT DOCUMENTS

| | | |
|---|---|---|
| 4,700,457 | 10/1987 | Matsukawa . |
| 4,860,254 | 8/1989 | Pott et al. . |
| 5,031,144 | 7/1991 | Persky . |
| 5,119,154 | 6/1992 | Gnadinger . |
| 5,122,477 | 6/1992 | Wolters et al. . |
| 5,155,573 | 10/1992 | Abe et al. . |
| 5,192,704 | 3/1993 | McDavid et al. . |
| 5,206,788 | * 4/1993 | Larson et al. ................... 361/313 |
| 5,271,955 | 12/1993 | Maniar . |
| 5,273,927 | 12/1993 | Gnadinger . |
| 5,293,075 | 3/1994 | Onishi et al. . |

(List continued on next page.)

FOREIGN PATENT DOCUMENTS

| | | |
|---|---|---|
| 0 469 934 A2 | 2/1992 | (EP) . |
| 0 513 894 A2 | 11/1992 | (EP) . |
| 0 642 167 A2 | 3/1995 | (EP) . |
| 11-126876 | * 5/1999 | (JP) . |
| 2000-243923 | * 9/2000 | (JP) . |

OTHER PUBLICATIONS

Chapman, S.P., et al., "Tuning PZT do Fabrication Processes by Optimizing Imprint", abstract, Ninth International Symposium on the Integrated Ferroelectrics, Santa Fe, New Mexico, Mar. 3, 1997.

Kim, D., et al., "MOCVD Growth and Characterization of PZT Thin Films", abstract, Ninth International Symposium on Integrated Ferroelectrics, Santa Fe, New Mexico, Mar. 1997.

Kim, D., et al., "Effects of Substrate Modification on the Growth and Characteristics of MOCVD PZT", pp. 67–69, Ninth International Symposium on Integrated Ferroelectrics, Santa Fe, New Mexico, Mar. 3, 1997.

Primary Examiner—Olik Chaudhuri
Assistant Examiner—Marcos D. Pizarro-Crespo
(74) Attorney, Agent, or Firm—Peter Meza; William J. Kubida, Esq.; Hogan & Hartson, LLP

(57) ABSTRACT

A ferroelectric capacitor includes a bottom electrode, a top electrode, and a ferroelectric layer located between the top and bottom electrodes that extends to completely encapsulate the top electrode, except for a contact hole to allow metalization of the top electrode. The total encapsulation of the top electrode reduces the sensitivity of the ferroelectric capacitor to hydrogen and thus improves electrical switching performance.

9 Claims, 17 Drawing Sheets

U.S. PATENT DOCUMENTS

| | | |
|---|---|---|
| 5,303,186 | 4/1994 | Yamauchi . |
| 5,350,705 | 9/1994 | Brassington et al. . |
| 5,371,700 | 12/1994 | Hamada . |
| 5,375,085 | 12/1994 | Gnade et al. . |
| 5,382,817 | 1/1995 | Kashihara et al. . |
| 5,383,150 | 1/1995 | Nakamura et al. . |
| 5,390,143 | 2/1995 | Manning . |
| 5,396,095 | 3/1995 | Wolters et al. . |
| 5,416,735 | 5/1995 | Onishi et al. . |
| 5,438,023 | 8/1995 | Argos et al. . |
| 5,440,173 | 8/1995 | Evans, Jr. et al. . |
| 5,475,248 | 12/1995 | Takenaka . |
| 5,479,316 * | 12/1995 | Smrtic et al. ................... 361/322 |
| 5,481,490 | 1/1996 | Wantanabe et al. . |
| 5,716,875 * | 2/1998 | Jones, Jr. et al. ................... 438/3 |
| 5,822,175 * | 10/1998 | Azuma ................... 361/321.5 |
| 6,027,947 | 2/2000 | Evans et al. . |

* cited by examiner

US 6,281,023 B2

COMPLETELY ENCAPSULATED TOP ELECTRODE OF A FERROELECTRIC CAPACITOR USING A LEAD-ENHANCED ENCAPSULATION LAYER

This application is a is a division of application Ser. No. 09/085,280, filed on May 27, 1998, now U.S. Pat. No. 6,211,542, issued Apr. 3, 2001, which is a continuation in part of application Ser. No. 08/828,157, filed Mar. 27, 1997, now U.S. Pat. No. 6,027,947, issued Feb. 22, 2000, which is a continuation in part of application Ser. No. 08/728,740, filed Oct. 10, 1996, now U.S. Pat. No. 5,864,932, issued Feb. 2, 1999, which continuation-in-part of my co-pending application entitled "COMPLETELY OR PARTIALLY ENCAPSULATED TOP ELECTRODE OF A FERROELECTRIC CAPACITOR" filed on Aug. 20, 1996 and having Ser. No. 08/700,076 now U.S. Pat. No. 5,920,453, issued Jul. 7, 1999.

BACKGROUND OF THE INVENTION

This invention relates generally to ferroelectric capacitors. More particularly, the present invention relates to a technique and structure for preventing degradation in the electrical performance of ferroelectric capacitors.

A portion of a prior art integrated circuit ferroelectric memory cell 10 including a transistor and a ferroelectric capacitor is shown in FIG. 1. A silicon or other substrate 12 includes a diffused region 14, which forms part of a transistor used in the memory cell. A thick oxide layer 16 forms the substrate for the ferroelectric capacitor. The thick oxide layer 16 is patterned and etched to allow access to diffused region 14. The ferroelectric capacitor includes a platinum bottom electrode 18, a ferroelectric layer 20, typically PZT (lead zirconate titanate), and a platinum top electrode 22. A subsequent oxide layer 24 is deposited, which is patterned and etched, to provide access to diffused region 14, bottom electrode 18, and to top electrode 22. A local interconnect layer 26 is deposited, patterned and etched, to provide a local interconnect 26A between top electrode 22 and diffused region 14, as well as metalization 26B for bottom electrode 18.

It is well known in the ferroelectric arts that certain ferroelectric materials, particularly PZT, are susceptible to degradation of electrical switching performance if exposed to hydrogen. One source of hydrogen can be found in the plastic packaging materials often used with integrated circuits. Another source of hydrogen can be found in the various oxide layers used in fabricating the ferroelectric capacitor or memory cell.

A section 28 of memory cell 10 is shown in greater magnification in FIG. 2 to illustrate the problem of hydrogen sensitivity that exists within the prior art memory cell. Section 28 shows oxide layer 16, bottom electrode 18, ferroelectric layer 20, top electrode 22, oxide layer 24, and local interconnect 26A. Note particularly in FIG. 2 that there is an interface between oxide layer 24 and ferroelectric layer 20. The interface extends along the top surface and sides of ferroelectric layer 20. During and after fabrication, hydrogen is generated within oxide layer 24, which in turn is gradually absorbed by ferroelectric layer 20. The arrows shown in FIG. 2 show generally the probable path of hydrogen diffusion into the ferroelectric layer 20. Studies have shown that exposure to hydrogen gradually degrades the amount of switching charge produced by the ferroelectric capacitor. Over time, the exposure to hydrogen may destroy electrical switching performance altogether.

What is desired, therefore, is a technique and structure to reduce hydrogen sensitivity in an integrated ferroelectric capacitor.

SUMMARY OF THE INVENTION

It is, therefore, a principal object of the present invention to improve the electrical switching performance of integrated circuit ferroelectric capacitors by reducing sensitivity to hydrogen.

It is another object of the invention to improve the performance of ferroelectric memory circuits.

It is an advantage of the invention that the fabrication methods set forth are generally compatible with existing ferroelectric capacitor and ferroelectric memory fabrication methods.

It is another advantage of the invention that the capacitor fabricated as set forth herein can be used in a wide array of electronic products such as integrated circuit memories and other integrated circuits, RF/ID integrated circuits and cards, discrete devices, or any application in which improved electrical switching performance and resistance to hydrogen diffusion is desired.

According to a first general embodiment of the present invention, a ferroelectric capacitor includes a bottom electrode, a top electrode, and a ferroelectric layer located between the top and bottom electrodes that extends to completely encapsulate the top electrode, except for a contact hole to allow metalization of the top electrode. The total encapsulation of the top electrode reduces the sensitivity of the ferroelectric capacitor to hydrogen and thus improves electrical switching performance.

According to a second general embodiment of the present invention, a ferroelectric capacitor includes a bottom electrode and a ferroelectric layer formed on the bottom electrode. The ferroelectric layer is partially etched to form an indentation to receive a top electrode. A dielectric layer is formed over the ferroelectric layer, and includes a contact hole to allow metalization of the top electrode. The partial encapsulation of the top electrode also reduces the sensitivity of the ferroelectric capacitor to hydrogen.

The ferroelectric layer in the capacitor can be fabricated using PZT, SBT, or other known ferroelectric materials. The ferroelectric capacitor can then be used in conjunction with a transistor to form a memory cell in an array of such cells.

A first method of fabricating a ferroelectric capacitor according to the present invention includes the steps of: forming in sequence a bottom electrode layer, a first ferroelectric layer, and a top electrode layer; etching the top electrode layer to form a top electrode; forming a second ferroelectric layer over the first ferroelectric layer, thereby completely encapsulating the top electrode; etching the second ferroelectric layer; etching the first ferroelectric layer and the bottom electrode layer to form a bottom electrode; forming a dielectric layer over the etched first ferroelectric and second ferroelectric layers; etching a contact hole through the dielectric layer and the second ferroelectric layer to allow metalization of the top electrode; and etching a contact hole through the dielectric layer and the first ferroelectric layer to allow metalization of the bottom electrode.

A second method of fabricating a ferroelectric capacitor according to the present invention includes the steps of: forming in sequence a bottom electrode layer, a first ferroelectric layer, and a top electrode layer; etching the top electrode layer to form a top electrode; etching the first ferroelectric layer; etching the bottom electrode layer to form a bottom electrode; forming a second ferroelectric layer over the first ferroelectric layer, thereby completely encapsulating the top electrode; etching the second ferroelectric layer so that the second ferroelectric layer overlaps the bottom electrode; forming a dielectric layer over the etched second ferroelectric layer; and etching contact holes through the dielectric layer and the second ferroelectric layer to allow metalization of the top and bottom electrodes.

A third method of fabricating a ferroelectric capacitor according to the present invention includes the steps of: forming in sequence a bottom electrode layer, a first ferroelectric layer, and a top electrode layer; etching the top electrode layer to form a top electrode; etching the first ferroelectric layer; etching the bottom electrode layer to form a bottom electrode; forming a second ferroelectric layer over the first ferroelectric layer, thereby completely encapsulating the top electrode; forming a dielectric layer over the second ferroelectric layer; and etching contact holes through the dielectric layer and the second ferroelectric layer to allow metalization of the top and bottom electrodes.

A fourth method of fabricating a ferroelectric capacitor according to the present invention includes the steps of: forming in sequence a bottom electrode layer, a first ferroelectric layer of a first thickness, and a top electrode layer; etching the top electrode layer to form a top electrode; etching the first ferroelectric layer; forming a second ferroelectric layer of a second thickness over the first ferroelectric layer, thereby completely encapsulating the top electrode; etching the second ferroelectric layer and the bottom electrode layer to form a bottom electrode; forming a dielectric layer over the etched second ferroelectric layer; and etching contact holes through the dielectric layer and the second ferroelectric layer to allow metalization of the top and bottom electrodes.

A fifth method of fabricating a ferroelectric capacitor according to the present invention includes the steps of: forming in sequence a bottom electrode layer and a ferroelectric layer; partially etching the ferroelectric layer to form an indentation; forming a conformal top electrode layer over the ferroelectric layer; etching away the top electrode layer to form a top electrode in the indentation; etching the ferroelectric layer; etching the bottom electrode layer to form a bottom electrode; forming a dielectric layer over the etched ferroelectric layer; and etching contact holes through the dielectric layer to allow metalization of the top and bottom electrodes.

A sixth method of fabricating a ferroelectric capacitor according to the present invention includes the steps of: forming a bottom electrode layer; etching the bottom electrode layer to form a bottom electrode; forming a ferroelectric layer over the bottom electrode; partially etching the ferroelectric layer to form an indentation; forming a conformal top electrode layer over the ferroelectric layer; etching away the top electrode layer to form a top electrode in the indentation; forming a dielectric layer over the ferroelectric layer; etching a contact hole through the dielectric layer to allow metalization of the top electrodes; and etching a contact hole through the dielectric layer and the ferroelectric layer to allow metalization of the bottom electrode.

An integrated circuit ferroelectric memory cell having a bit line, a word line, and a plate line, fabricated according to the present invention includes: a silicon substrate or epitaxial region; a transistor formed in the substrate including first and second diffused regions, a thin gate oxide, and a gate forming the word line; a thick oxide layer formed on the substrate including contact holes to allow metalization of the first and second diffused regions; a ferroelectric capacitor formed on the thick oxide layer, the ferroelectric capacitor including a bottom electrode, a ferroelectric layer, and a top electrode, wherein the ferroelectric layer either partially or completely encapsulates the top electrode and includes a contact hole to allow metalization of the top electrode; a first dielectric layer formed over the thick oxide layer and the ferroelectric capacitor including contact holes to allow metalization of the first and second diffused regions, and the top and bottom electrodes of the ferroelectric capacitor; a first patterned metalization layer for contacting the first diffused region, for forming a local interconnect between the top electrode and the second diffused region, and for metalizing the bottom electrode; a second dielectric layer formed over the first metalization layer including contact holes to allow metalization of the first diffused region and the bottom electrode; a second patterned metalization layer for contacting the first diffused region to form the bit line, and for contacting the bottom electrode to form the plate line; and a passivation layer formed over the second metalization layer. If desired, the first dielectric layer, the second dielectric layer, and the passivation layer can each be formed as a ferroelectric layer for an even greater resistance to hydrogen degradation.

The foregoing and other objects, features and advantages of the invention will become more readily apparent from the following detailed description of a preferred embodiment of the invention which proceeds with reference to the accompanying drawings.

DETAILED DESCRIPTION

Referring now to FIGS. 3–9, sequential sectional views of a first ferroelectric capacitor process suitable for use in a ferroelectric memory having decreased hydrogen sensitivity are shown.

Figure 1:
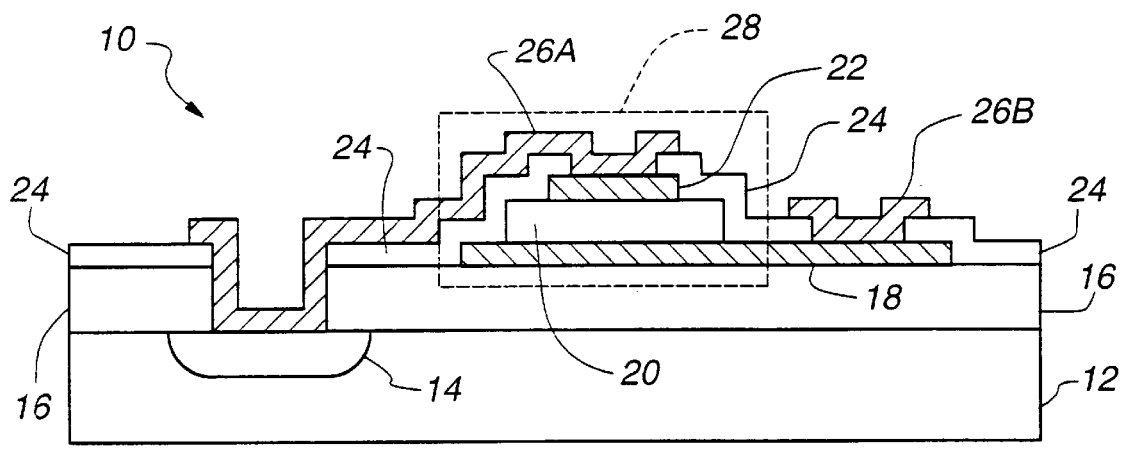
FIG. 1 is a sectional view of a portion of a prior art integrated circuit ferroelectric memory including a ferroelectric capacitor and a transistor.
Figure 2:
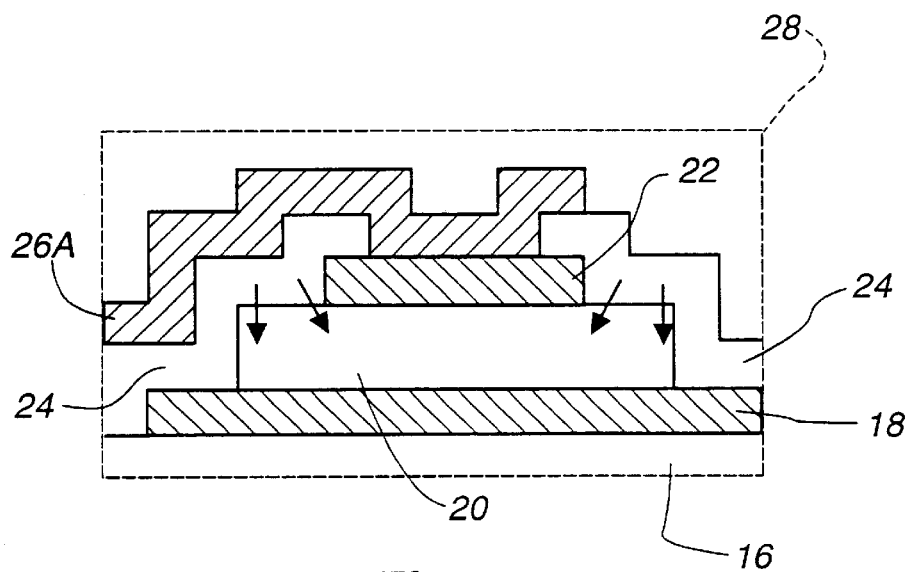
FIG. 2 is a magnified view of a prior art ferroelectric capacitor illustrating particularly the problem of hydrogen diffusion into the ferroelectric dielectric layer resulting in degradation of electrical switching performance.
Figure 3:
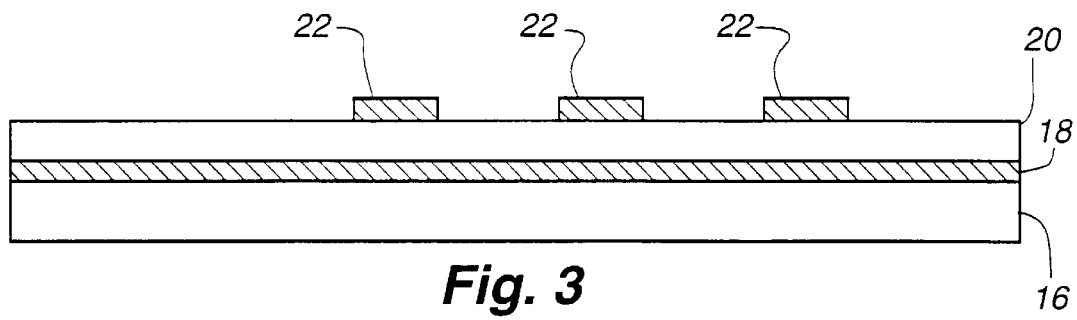
FIGS. 3–9 are sequential sectional views of a ferroelectric capacitor process suitable for use in a ferroelectric memory having decreased hydrogen sensitivity according to a first embodiment of the invention.

In FIG. 3, a layer 16 of BPSG glass about 7000 Angstroms thick is deposited onto a silicon or other substrate (not shown). Any oxide, nitride, or other appropriate dielectric layer can be substituted for BPSG layer 16. A platinum bottom electrode layer 18 is subsequently deposited over BPSG glass layer 16 to a thickness of about 1750 Angstroms. While platinum is used for electrode layer 18, other known materials compatible with ferroelectric films can be used including iridium, iridium oxide, and the like. The bottom electrode layer 16 also includes a titanium adhesion layer about 200 Angstroms thick to facilitate the adhesion of the platinum bottom electrode layer 18 to BPSG glass layer 16. A first ferroelectric layer 20 is subsequently deposited over the bottom electrode layer 18 to a thickness of about 3000 Angstroms. The material used in ferroelectric layer 20 is ideally doped or undoped PZT (lead zirconate titanate), SBT (strontium bismuth tantalate), or any other known ferroelectric material suitable for use in thin film form. After the ferroelectric layer 20 is deposited, a first anneal is performed. The first anneal includes a 650° C. heat treatment for about five seconds, followed by an 850° C. heat treatment for about five seconds.

A platinum top electrode layer 22 is subsequently deposited over the first ferroelectric layer 20 to a thickness of about 1750 Angstroms. The material used in top electrode layer 22 can be other than platinum as described above. Top electrode layer 22 is etched to form one or more top electrodes. Platinum is typically etched using a reactive-ion etch in an argon and chlorine atmosphere, although other gases can be used. Ion milling can be used as well as an alternative etching technique. The dimensions of the individual top electrodes can modified as desired from nominal dimensions of 1.5×1.5 microns, with a spacing of about three microns between top electrodes. After the platinum top electrode layer 20 is etched to define the individual top electrodes, a second anneal is performed. The second anneal includes a 650° C. heat treatment for about sixty minutes in an oxygen atmosphere.

Figure 4:
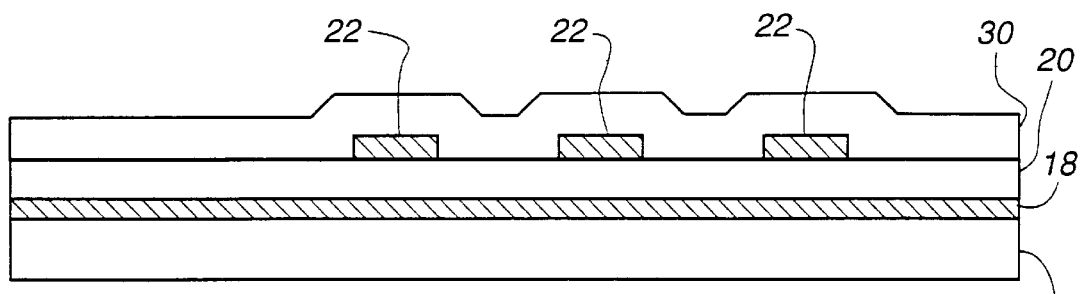

In FIG. 4, a second "cap" ferroelectric layer 30 about the same thickness (3000 Angstroms) as the first ferroelectric layer 20 is deposited over the first ferroelectric layer 20, thereby completely encapsulating the top electrodes 22. The material used in the second ferroelectric layer 30 is also ideally doped or undoped PZT (lead zirconate titanate), SBT (strontium bismuth tantalate), or any other known ferroelectric material suitable for use in thin film form. The first and second ferroelectric layers need not be the same ferroelectric material, since the second layer is used for its resistance to hydrogen diffusion or hydrogen "gettering" properties and not specifically for its ferroelectric properties. After the second ferroelectric layer 30 is deposited, an optional third anneal can be performed. The optional third anneal includes a 650° C. heat treatment for about sixty minutes in an oxygen atmosphere.

Figure 5:
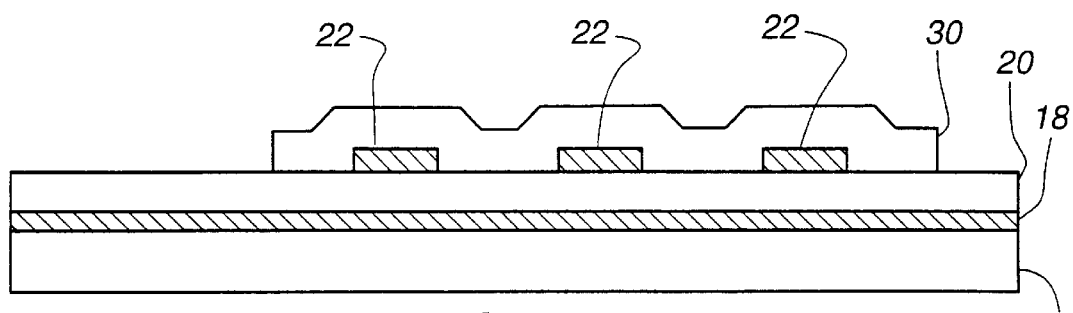

In FIG. 5, the second ferroelectric layer 30 is etched according to the same etching method as set forth for the first ferroelectric layer 20. The second ferroelectric layer 30 is etched to leave a reasonable overlap of the top electrodes 22, about 1.5 to 2.0 microns.

Figure 6:
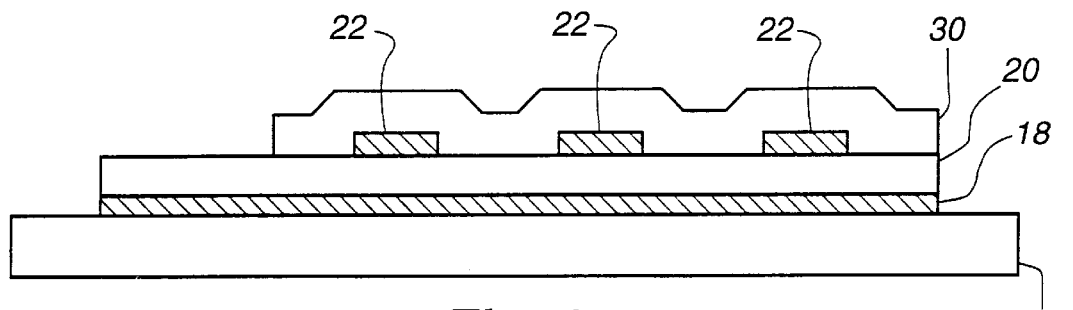

In FIG. 6, the first ferroelectric layer 20 and the bottom electrode layer 18 are simultaneously etched to define the dimensions of a bottom electrode. As can be seen in FIG. 6, one end of the bottom electrode 18 is etched to allow sufficient room for an eventual bottom electrode contact. The other end of bottom electrode 18 is etched to the same dimensions as the second ferroelectric layer 30. The first ferroelectric layer 20 and the bottom electrode layer 18 are simultaneously etched using a reactive-ion etch in an argon and carbon tetrafluoride atmosphere, although other gases can be used. Ion milling can also be used as an alternative etching technique. After the first ferroelectric layer 20 and bottom electrode layer 18 are etched, an optional first recovery anneal can be performed. The optional first recovery anneal includes a 550° C. heat treatment for about sixty minutes in an oxygen atmosphere.

Figure 7:
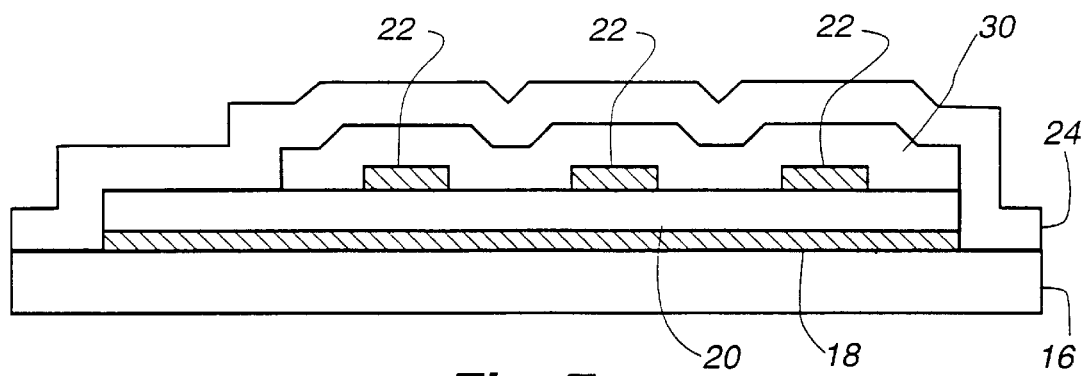

In FIG. 7, a PTEOS glass dielectric layer 24 is deposited over the etched first ferroelectric and second ferroelectric layers 20 and 30 to a thickness of about 5000 Angstroms. Other dielectric layers can be used for dielectric layer 24.

Figure 8:
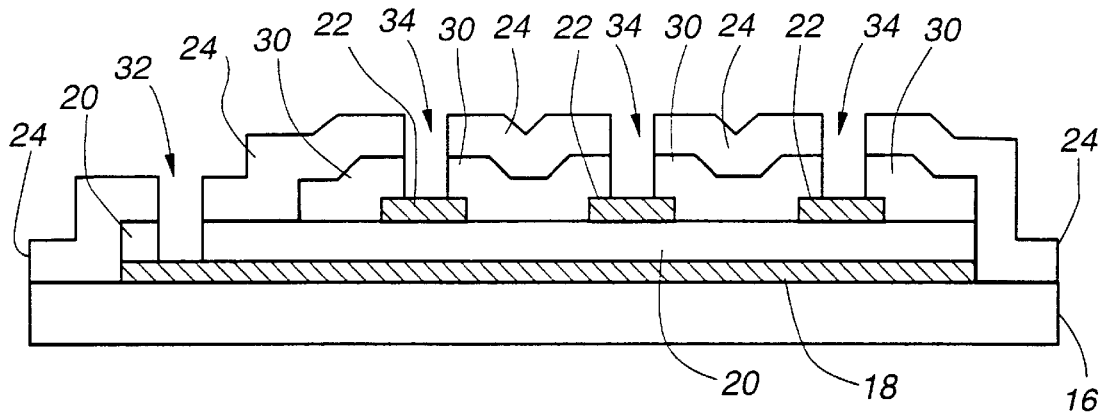

In FIG. 8, contact holes are etched to provide access of the top and bottom electrodes 22 and 18. Contact hole 32 provides access to bottom electrode 18, and contact holes 34 provide access to top electrodes 22. Contact holes 34 are etched through the dielectric layer 24 and the second ferroelectric layer 30 to allow metalization of the top electrodes. Contact hole 32 is etched through the dielectric layer 24 and the first ferroelectric layer 20 to allow metalization of bottom electrode 18. Note that the contact holes 32 and 34 are ideally etched in two steps. The first etching step removes the dielectric layer 24 in the contact holes. The dielectric oxide material can be etched away using a fluorine-based wet or dry etch. It is desirable that a sloped profile is etched into the contact holes. After the dielectric oxide material is removed, the remaining ferroelectric material in the contact hole is etched away according to the ferroelectric etch described above. Note in FIG. 8 that contact holes 32 and 34 are etched through about the same thickness of material, i.e. 5000 Angstroms of glass plus 3000 Angstroms of ferroelectric material. Therefore, the etching of contact holes 32 and 34 can be performed simultaneously. After contact holes 32 and 34 are etched, an optional second recovery anneal can be performed. The optional second recovery anneal includes a 550° C. heat treatment for about sixty minutes in an oxygen atmosphere.

Figure 9:
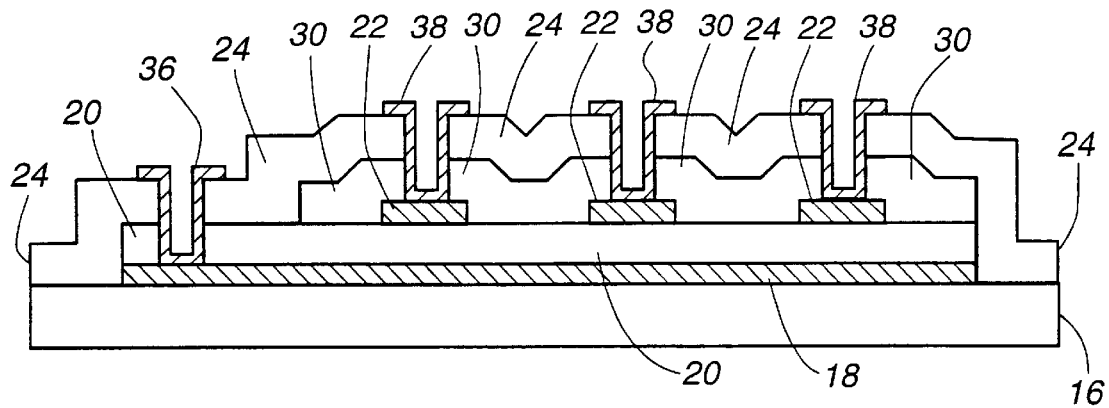
Figure 52:
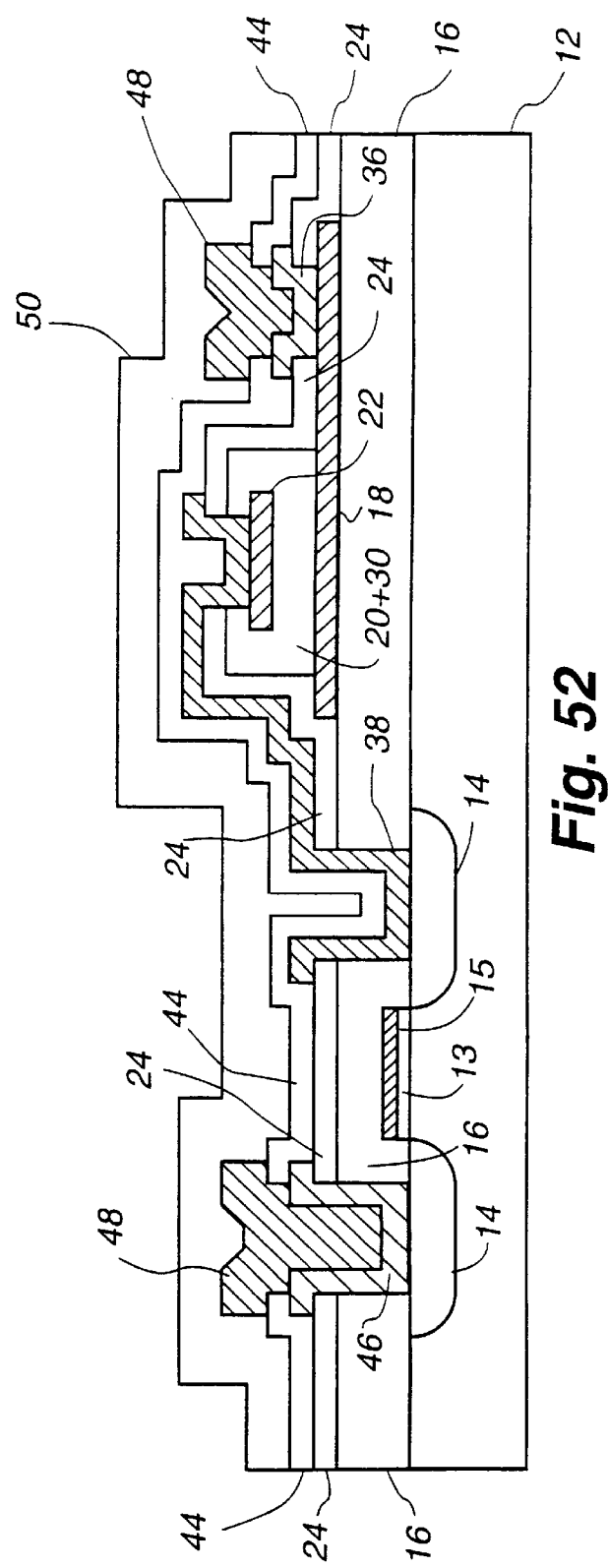
FIG. 52 is a sectional view of a completely metalized integrated circuit ferroelectric memory, in which the top electrode of the ferroelectric capacitor is completely encapsulated according to the present invention.

In FIG. 9, contact holes 32 and 34 are metalized to provide electrical access to bottom electrode 18 and top electrodes 22. A titanium nitride local interconnect metalization layer is deposited to a thickness of about 800 Angstroms and etched to form a metal contact 36 for bottom electrode 18 and a metal contact 38 for each of the top electrodes 22. The full metalization scheme showing subsequent oxide and metalization layers for a ferroelectric memory cell is shown in FIG. 52, although other metalization schemes can be used. For example, a titanium layer about 1500 Angstroms thick followed by an aluminum layer of about 8000 Angstroms thick can be used to form metal contacts 36 and 38. Other metalization techniques can be used as well after the titanium nitride layer has been deposited.

Figure 10:
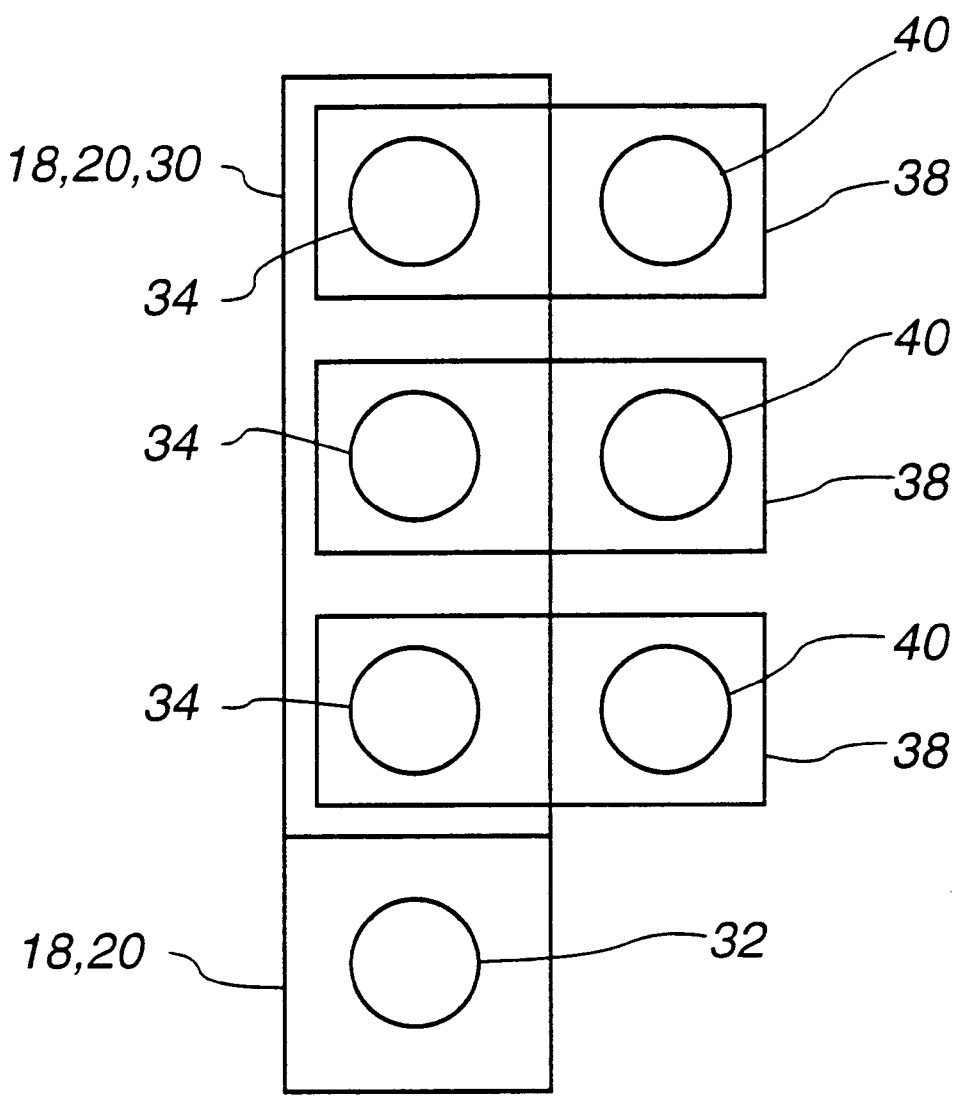
FIG. 10 is a plan view of a set of ferroelectric capacitors fabricated according to the process shown in FIGS. 3–9.

A plan view of the capacitor structure described above with respect to FIGS. 3–9 is shown in FIG. 10. The bottom electrode 18 and first ferroelectric layer 20 are shown as coincident layers forming a first rectangle. A second, smaller rectangle is formed of the bottom electrode 18, the first ferroelectric layer 20, and the second ferroelectric layer 30. The contact holes to the bottom and top electrodes 32 and 34 are shown as circular features. The local interconnect metal contact straps 38 that contact the top electrodes 22 are shown as individual rectangles overlapping contact holes 34 and 40. Contact holes 40 are not shown in FIGS. 3–9 but represent a contact to another structure such as the diffused region of a transistor as is shown in FIG. 52.

Referring now to FIGS. 11–17, sequential sectional views of a second ferroelectric capacitor process suitable for use in a ferroelectric memory having decreased hydrogen sensitivity are shown.

Figure 11:
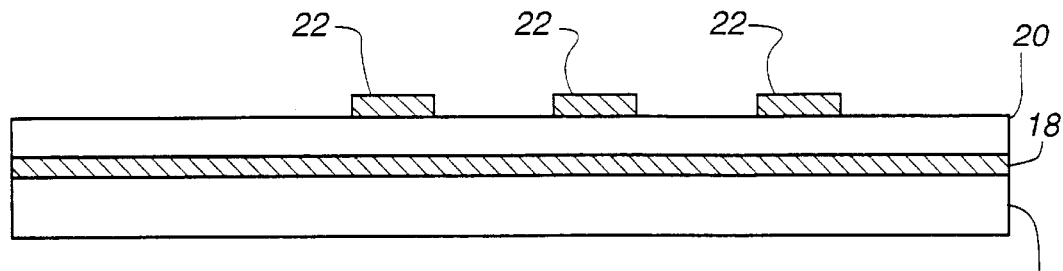
FIGS. 11–17 are sequential sectional views of a ferroelectric capacitor process suitable for use in a ferroelectric memory having decreased hydrogen sensitivity according to a second embodiment of the invention.

FIG. 11 is the same sectional view as FIG. 3, showing the sequential deposition of a thick glass layer 16, a bottom electrode layer 18, a first ferroelectric layer 20, and a top electrode layer 22. All of the thicknesses and materials described above are the same in FIG. 11. A first anneal can be performed after the first ferroelectric layer 18 is deposited. The platinum top electrode layer 22 is etched to form individual top electrodes 22. A second anneal can be performed after the top electrodes 22 are etched.

Figure 12:
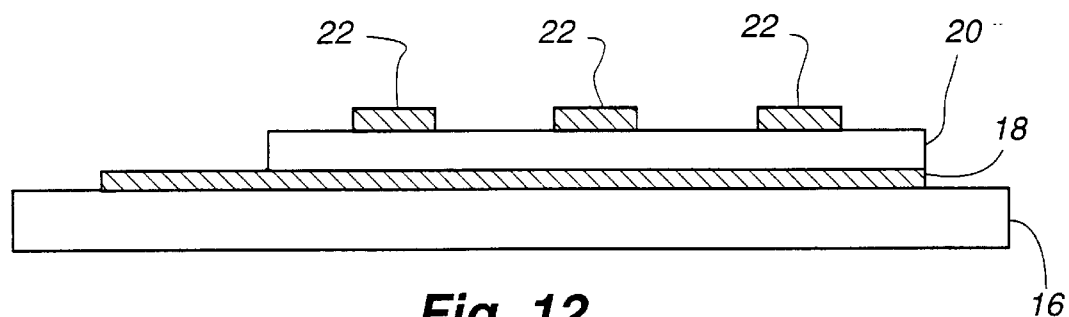

In FIG. 12, the first ferroelectric layer 20 is etched with some lateral overlap of the etched top electrodes 22. The bottom electrode layer 18 is etched to define the dimensions of a bottom electrode. As can be seen in FIG. 12, one end of the bottom electrode 18 is etched to allow sufficient room for the eventual bottom electrode contact. The other end of bottom electrode 18 is etched to the same dimensions as the first ferroelectric layer 20. The etching techniques for bottom electrode 18 and first ferroelectric layer 20 are as described above with reference to FIGS. 3–11. After the first ferroelectric layer 20 and bottom electrode layer 18 are etched, an optional first recovery anneal can be performed. The optional first recovery anneal includes a 550° C. heat treatment for about sixty minutes in an oxygen atmosphere.

Figure 13:
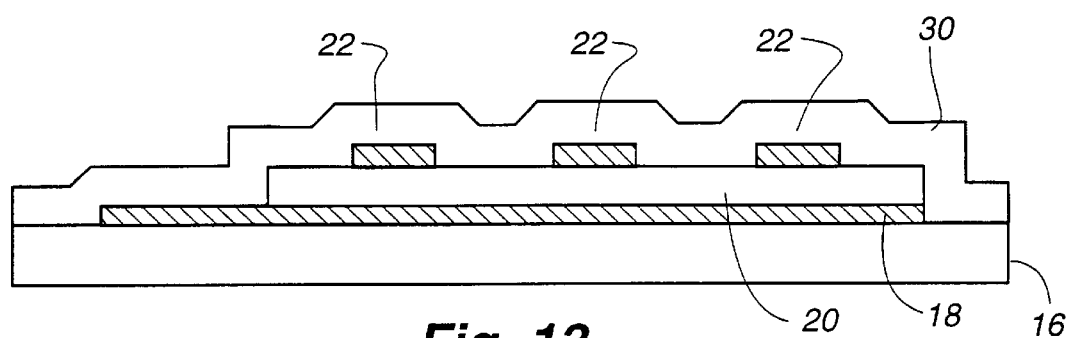

In FIG. 13, a second "cap" ferroelectric layer 30 about the same thickness (3000 Angstroms) as the first ferroelectric layer 20 is deposited over the first ferroelectric layer 20, thereby completely encapsulating the top electrodes 22.

After the second ferroelectric layer 30 is deposited, an optional third anneal can be performed. The optional third anneal includes a 650° C. heat treatment for about sixty minutes in an oxygen atmosphere.

Figure 14:
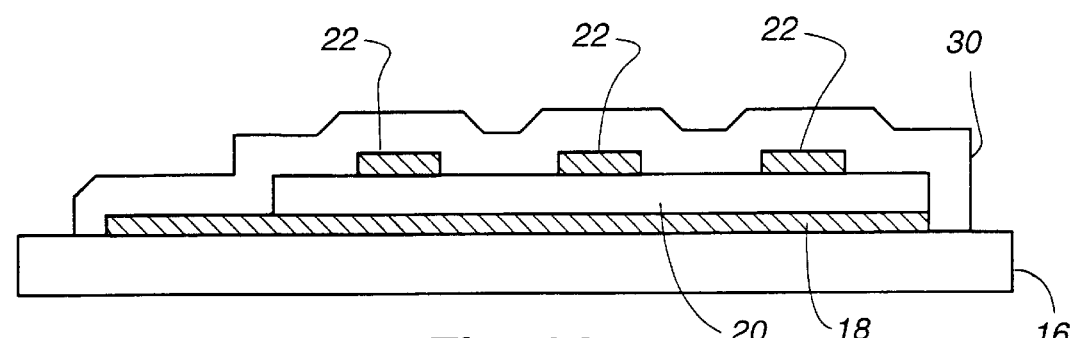

In FIG. 14, the second ferroelectric layer 30 is etched according to the same etching method as set forth for the first ferroelectric layer 20. The second ferroelectric layer 30 is etched to leave a reasonable overlap of the bottom electrode 18, about 1.5 to 2.0 microns. After the second ferroelectric layer 30 is etched, an optional second recovery anneal can be performed.

Figure 15:
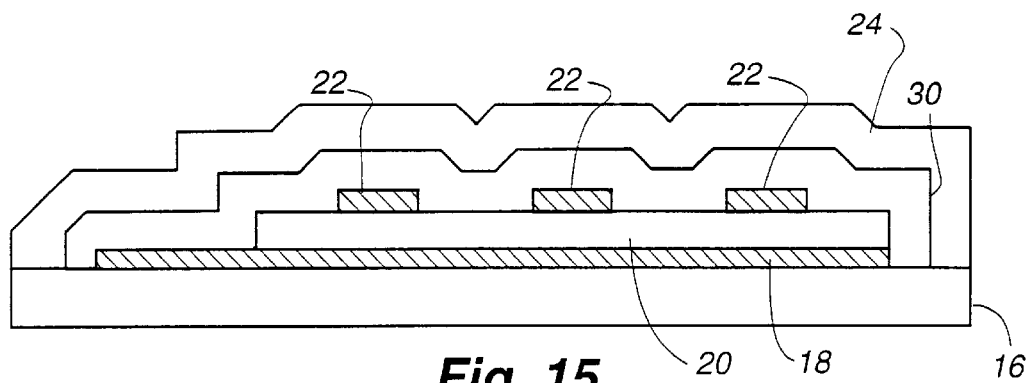

In FIG. 15, a PTEOS glass dielectric layer 24 is deposited over the etched second ferroelectric layers 30 to a thickness of about 5000 Angstroms.

Figure 16:
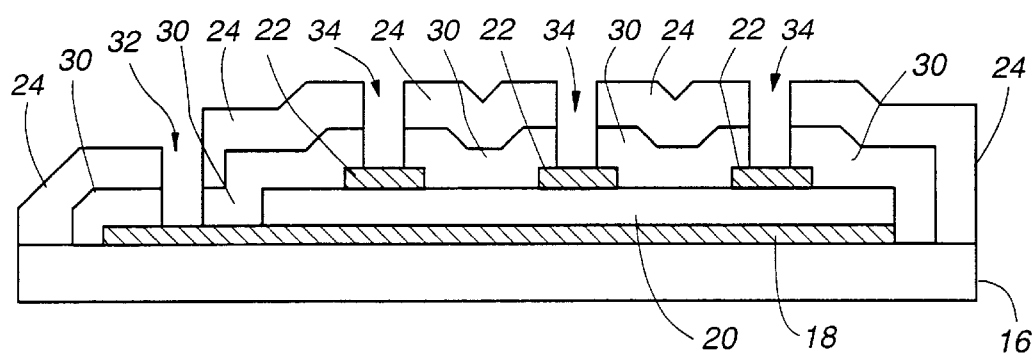

In FIG. 16, contact holes are etched to provide access of the top and bottom electrodes 22 and 18. Contact hole 32 provides access to bottom electrode 18, and contact holes 34 provide access to top electrodes 22. Note that in FIG. 16, both contact holes 34 and 32 are etched through the dielectric layer 24 and the second ferroelectric layer 30 to allow metalization of the top and bottom electrodes. The thickness of contact holes 34 and 32 is the same since they are etched through the same thickness of material. Contact holes 32 and 34 are ideally simultaneously etched in two steps to remove the dielectric oxide material and then the remaining ferroelectric material. The type of etch used in the same as described with reference to FIG. 8. After contact holes 32 and 34 are etched, an optional second recovery anneal can be performed.

Figure 17:
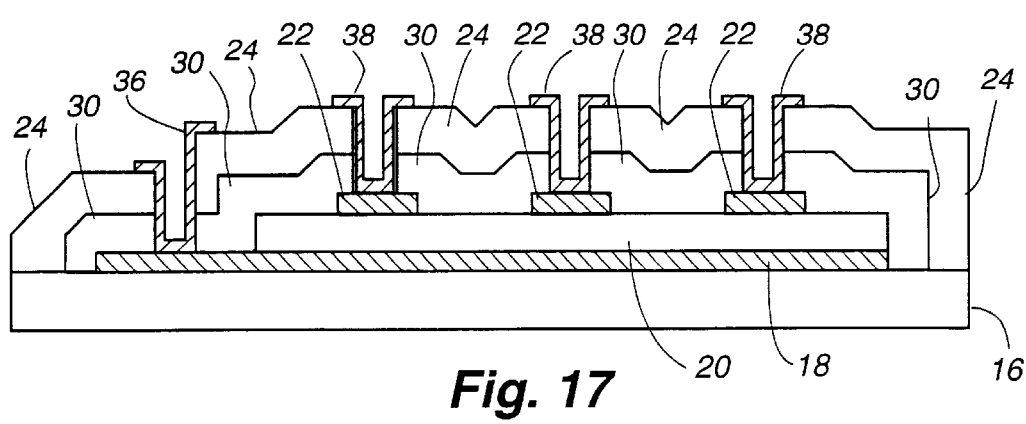

In FIG. 17, contact holes 32 and 34 are metalized to provide electrical access to bottom electrode 18 and top electrodes 22. A titanium nitride local interconnect metalization layer is deposited to a thickness of about 800 Angstroms and etched to form a metal contact 36 for bottom electrode 18 and a metal contact 38 for each of the top electrodes 22. The full metalization scheme showing subsequent oxide and metalization layers for a ferroelectric memory cell is shown in FIG. 52, although other metalization schemes can be used.

Figure 18:
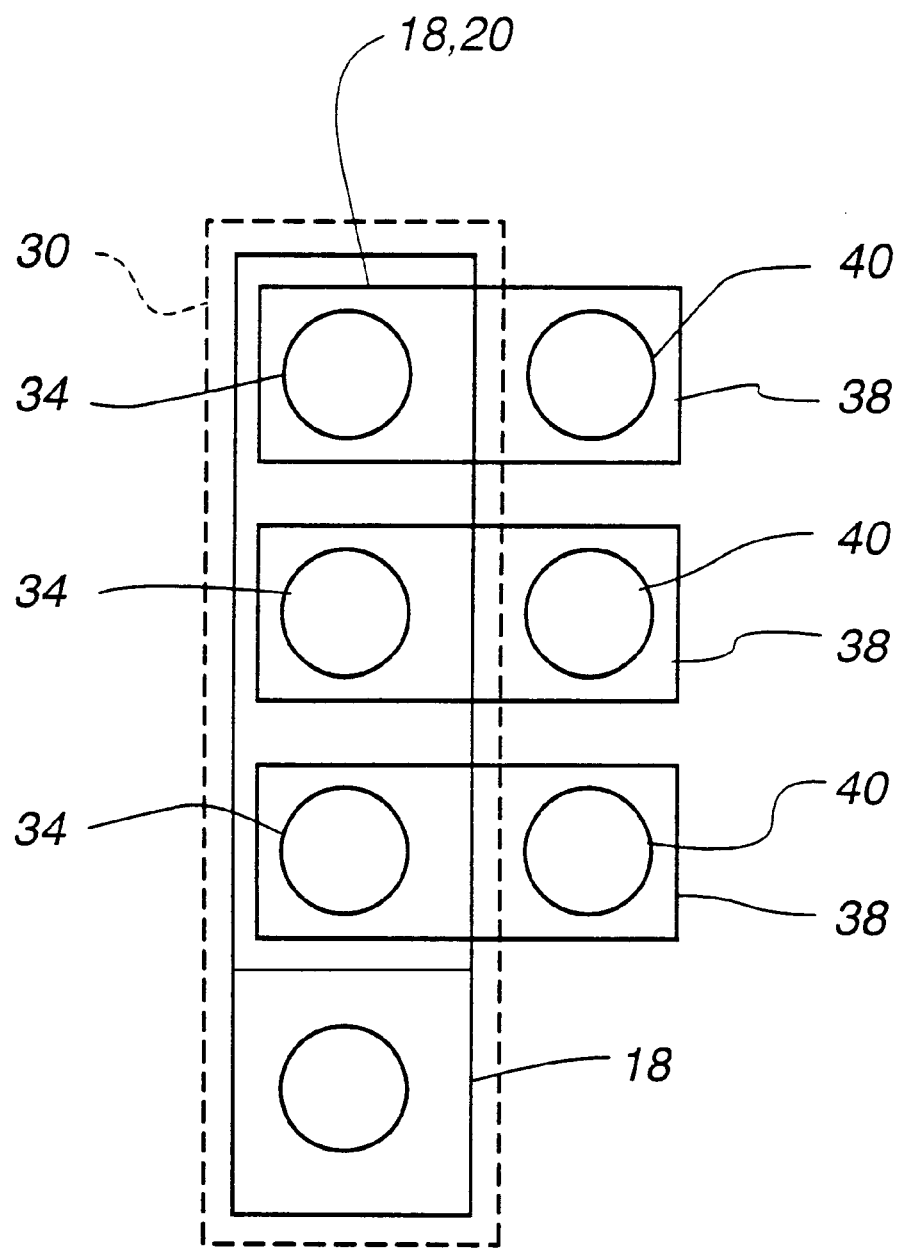
FIG. 18 is a plan view of a set of ferroelectric capacitor fabricated according to the process shown in FIGS. 11–17.

A plan view of the capacitor structure described above with respect to FIGS. 11–17 is shown in FIG. 18. The bottom electrode 18 is shown as forming a first rectangle. A second, smaller rectangle is formed of the bottom electrode 18 and the first ferroelectric layer 20. The second ferroelectric layer 30 is shown as a dashed rectangle overlapping the bottom electrode 18. The contact holes to the bottom and top electrodes 32 and 34 are shown as circular features. The local interconnect metal contact straps 38 that contact the top electrodes 22 are shown as individual rectangles overlapping contact holes 34 and 40. Contact holes 40 are not shown in FIGS. 11–17 but represent a contact to another structure such as the diffused region of a transistor as is shown in FIG. 52.

Referring now to FIGS. 19–24, sequential sectional views of a third ferroelectric capacitor process suitable for use in a ferroelectric memory having decreased hydrogen sensitivity are shown.

Figure 19:
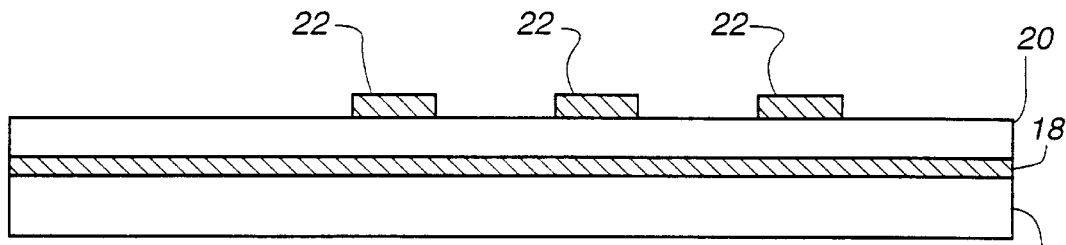
FIGS. 19–24 are sequential sectional views of a ferroelectric capacitor process suitable for use in a ferroelectric memory having decreased hydrogen sensitivity according to a third embodiment of the invention.
Figure 20:
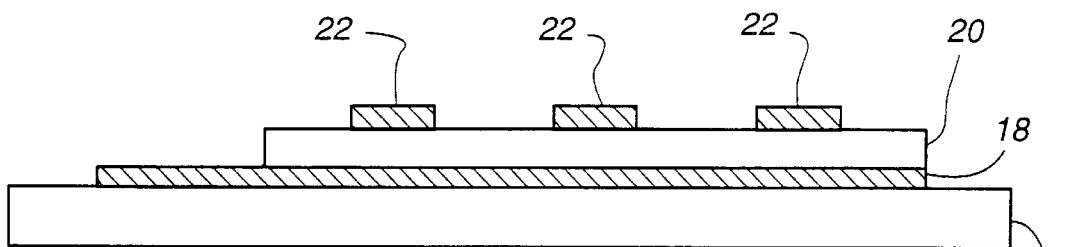
Figure 21:
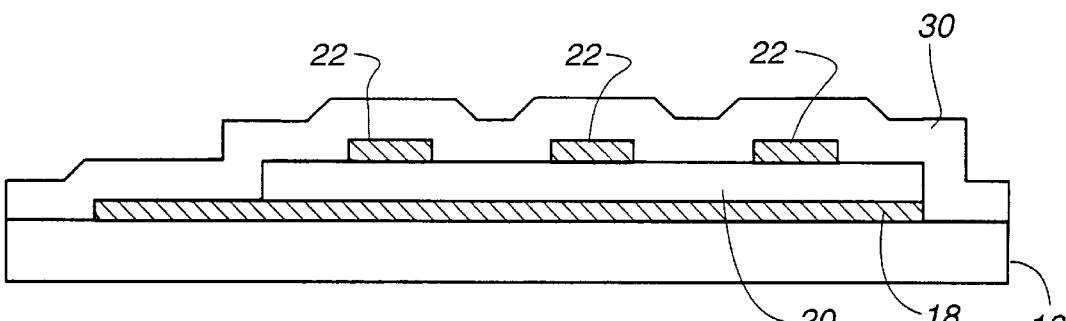

FIGS. 19–21 are identical to previously described FIGS. 11–13 both in sectional views, material, etching, and annealing steps. FIG. 19 shows a thick glass layer 16, a bottom electrode layer 18, a first ferroelectric layer 20, and a top electrode layer 22 formed in sequence, wherein the top electrode layer 22 is etched to form individual top electrodes 22. FIG. 20 shows the etching of the first ferroelectric layer 20 and the etching of the bottom electrode layer 18 to form a bottom electrode. In FIG. 21, a second "cap" ferroelectric layer 30 about the same thickness (3000 Angstroms) as the first ferroelectric layer 20 is deposited over the first ferroelectric layer 20, thereby completely encapsulating the top electrodes 22. A first anneal is performed after the ferroelectric layer 20 is deposited, a second anneal is performed after the top electrode layer 22 is etched, and an optional third anneal is performed after the second ferroelectric layer 30 is deposited. A optional first recovery anneal is performed after the first ferroelectric layer 20 and bottom electrode layer 18 have been etched.

Figure 22:
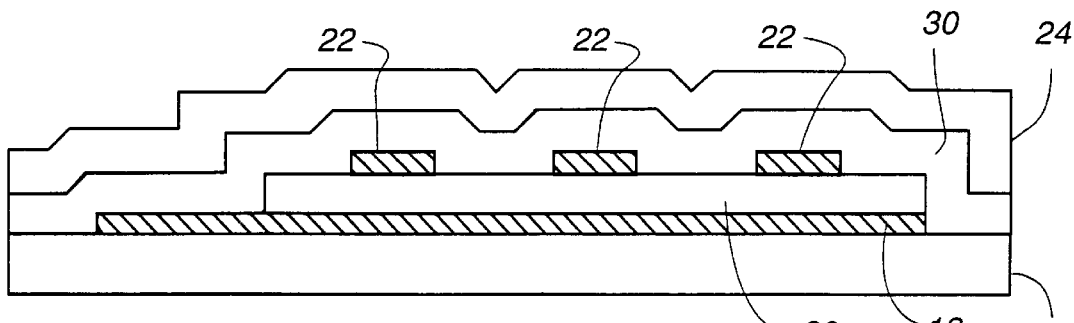

In FIG. 22, a PTEOS glass dielectric layer 24 is deposited over the unetched second ferroelectric layer 30 to a thickness of about 5000 Angstroms.

Figure 23:
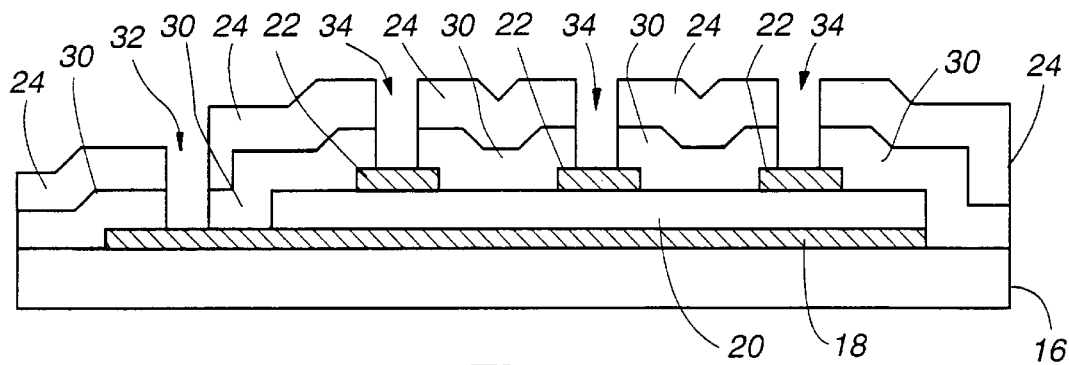

In FIG. 23, contact holes are etched to provide access of the top and bottom electrodes 22 and 18. Contact hole 32 provides access to bottom electrode 18, and contact holes 34 provide access to top electrodes 22. Note that in FIG. 23, both contact holes 34 and 36 are etched through the dielectric layer 24 and the second ferroelectric layer 30 to allow metalization of the top and bottom electrodes. The thickness of contact holes 34 and 32 is the same since they are etched through the same thickness of material. Contact holes 32 and 34 are ideally simultaneously etched in two steps to remove the dielectric oxide material and then the remaining ferroelectric material. The type of etch used in the same as described with reference to FIG. 8. A second optional recovery anneal can be performed after contact holes 32 and 34 have been opened.

Figure 24:
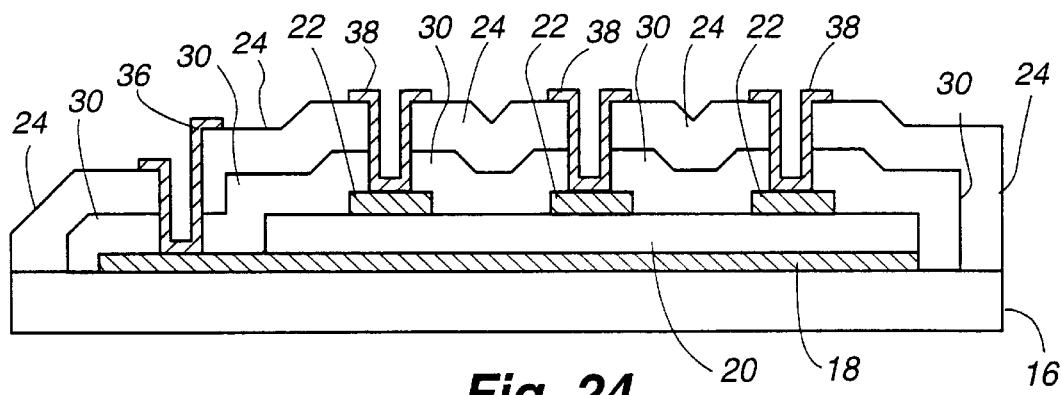

In FIG. 24, contact holes 32 and 34 are metalized to provide electrical access to bottom electrode 18 and top electrodes 22. A titanium nitride local interconnect metalization layer is deposited to a thickness of about 800 Angstroms and etched to form a metal contact 36 for bottom electrode 18 and a metal contact 38 for each of the top electrodes 22. The full metalization scheme showing subsequent oxide and metalization layers for a ferroelectric memory cell is shown in FIG. 52, although other metalization schemes can be used.

Figure 25:
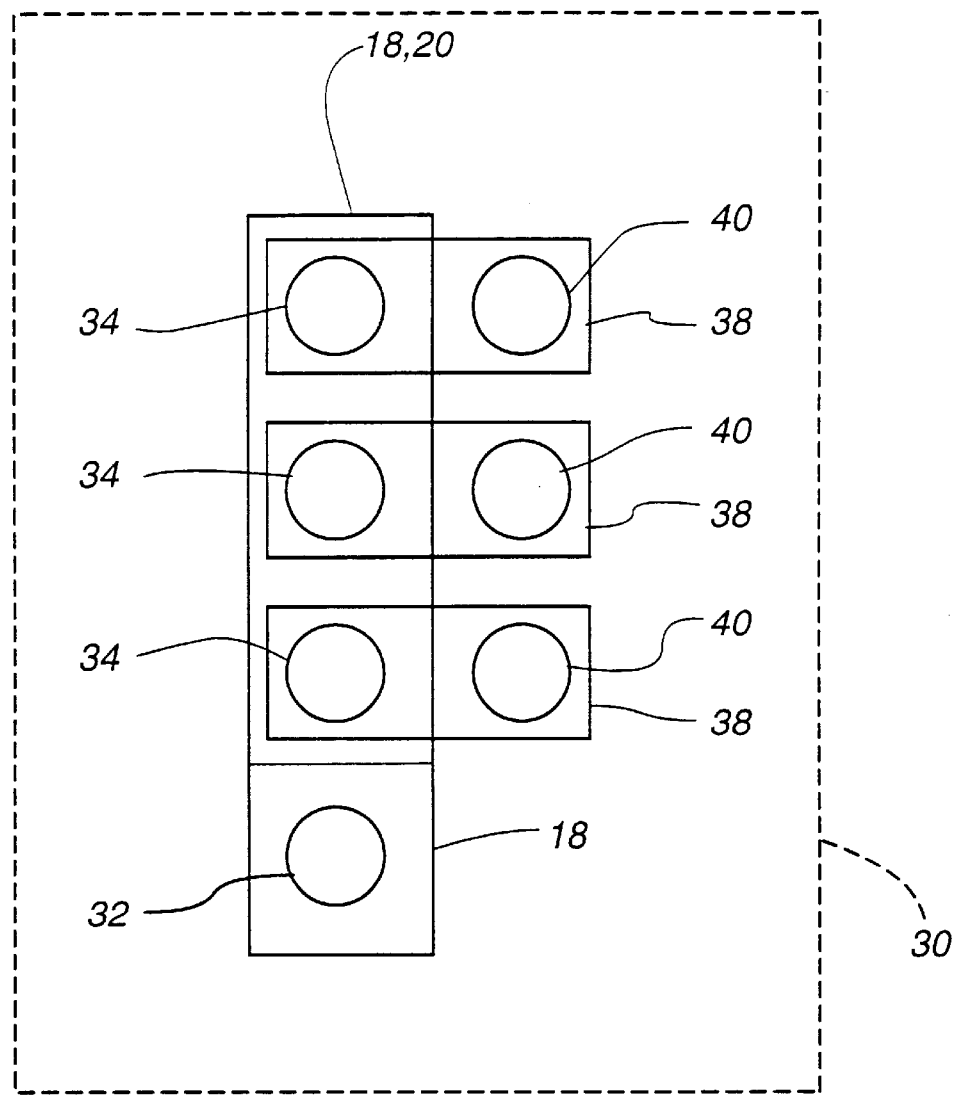
FIG. 25 is a plan view of a set of ferroelectric capacitor fabricated according to the process shown in FIGS. 19–24.

A plan view of the capacitor structure described above with respect to FIGS. 19–24 is shown in FIG. 25. The bottom electrode 18 is shown as forming a first rectangle. A second, smaller rectangle is formed of the bottom electrode 18 and the first ferroelectric layer 20. The second ferroelectric layer 30 is shown as a dashed rectangle overlapping the bottom electrode 18 by a wide margin. The wide margin shown is meant to convey the unetched, continuous extent of the second ferroelectric layer 30. The contact holes to the bottom and top electrodes 32 and 34 are shown as circular features. The local interconnect metal contact straps 38 that contact the top electrodes 22 are shown as individual rectangles overlapping contact holes 34 and 40. Contact holes 40 are not shown in FIGS. 19–24 but represent a contact to another structure such as the diffused region of a transistor as is shown in FIG. 52.

Referring now to FIGS. 26–32, sequential sectional views of a fourth ferroelectric capacitor process suitable for use in a ferroelectric memory having decreased hydrogen sensitivity are shown. The fourth ferroelectric capacitor process described below allows the thickness of the second ferroelectric layer 30 to be different from the first ferroelectric layer 20, if desired.

Figure 26:
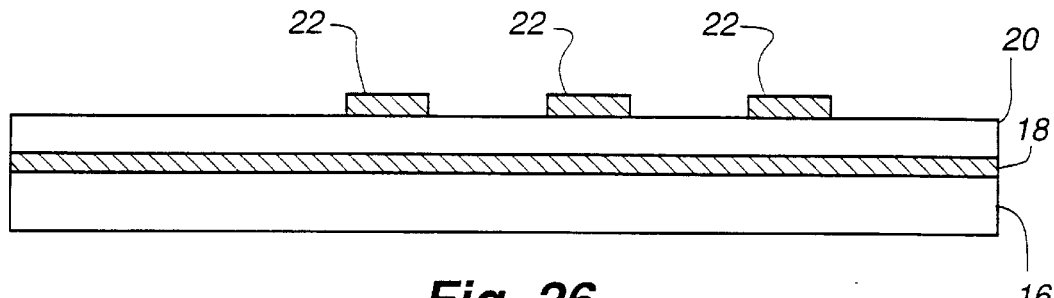
FIGS. 26–32 are sequential sectional views of a ferroelectric capacitor process suitable for use in a ferroelectric memory having decreased hydrogen sensitivity according to a fourth embodiment of the invention.

FIG. 26 is the same as previously described FIGS. 3, 11, and 19. A first anneal is performed after the first ferroelectric layer 20 is deposited, and a second anneal is performed after the top electrode layer 22 is etched.

Figure 27:
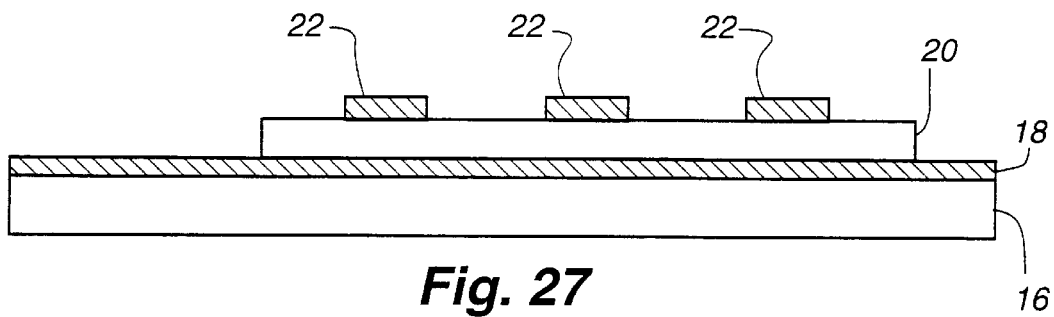

In FIG. 27, only the first ferroelectric layer 20 is etched to a reasonable overlap of the etched top electrodes 22. The bottom electrode layer 18 remains unetched in FIG. 27. An optional first recovery anneal is performed after the first ferroelectric layer 20 is etched.

Figure 28:
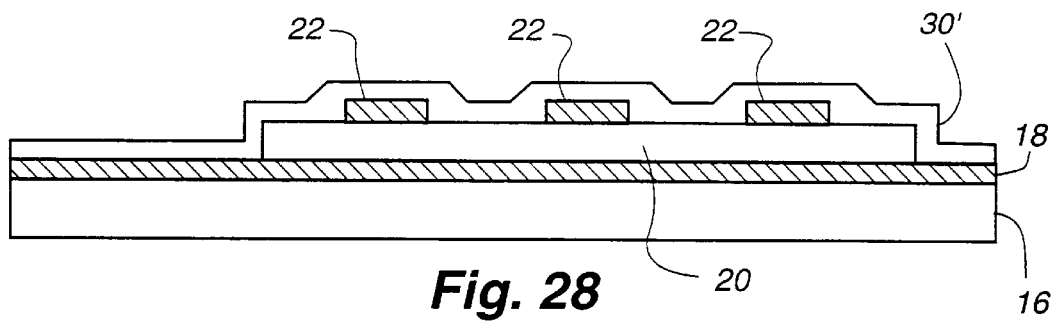

In FIG. 28, a second "cap" ferroelectric layer 30' of a different thickness (less than or greater than 3000 Angstroms) from the first ferroelectric layer 20 is deposited over the first ferroelectric layer 20, thereby completely encapsulating the top electrodes 22. A less thick second ferroelectric layer 30' is desirable since less material is used, it is easier to etch, more planar, and for other processing reasons. However, if desired, the same or a thicker ferroelectric layer 30' can be used. The material used for the second ferroelectric layer 30' is the same as described above, and can be different than the material used in the first ferroelectric layer 20. An optional third anneal can be performed after the second ferroelectric layer 30' is deposited.

Figure 29:
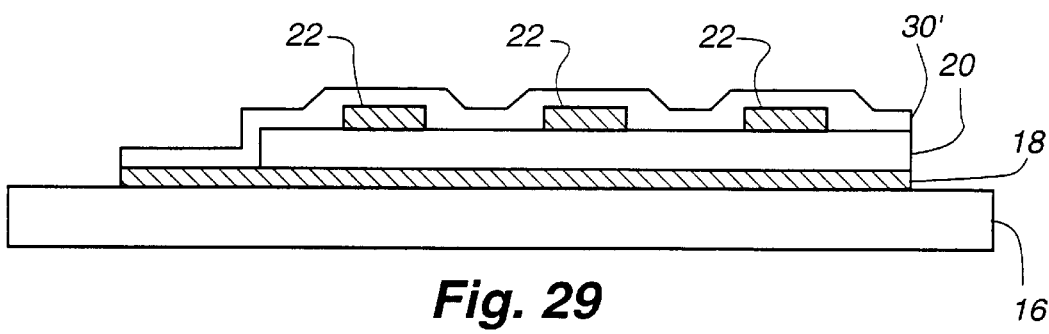

In FIG. 29, the second ferroelectric layer 30' and the bottom electrode layer 18 are simultaneously etched to form a bottom electrode. After the bottom electrode layer 18 and second ferroelectric layer 30' have been etched, an optional second recovery anneal can be performed.

Figure 30:
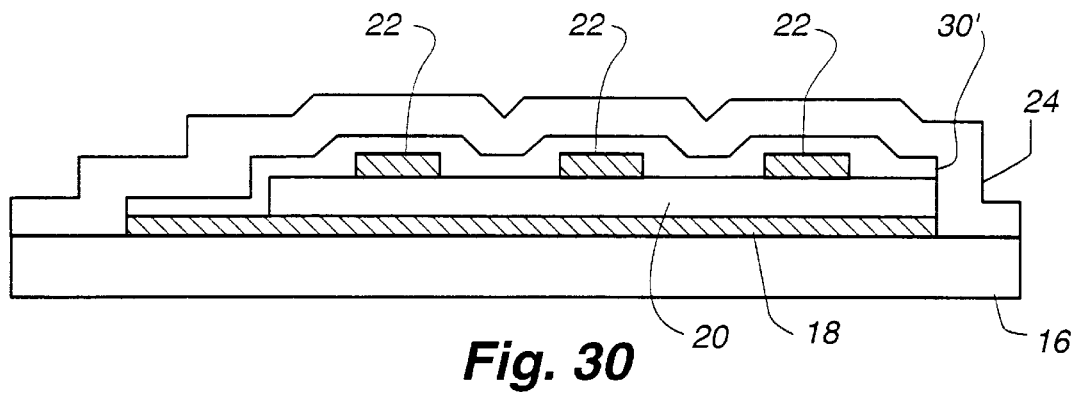

In FIG. 30, a PTEOS glass dielectric layer 24 is deposited over the etched second ferroelectric layer 30' to a thickness of about 5000 Angstroms.

Figure 31:
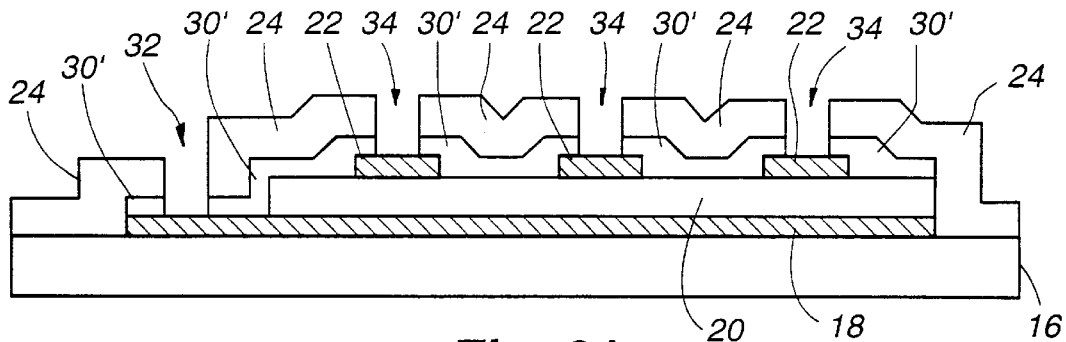

In FIG. 31, contact holes are etched to provide access of the top and bottom electrodes 22 and 18. Contact hole 32 provides access to bottom electrode 18, and contact holes 34 provide access to top electrodes 22. Note that in FIG. 31, both contact holes 34 and 32 are etched through the dielectric layer 24 and the second ferroelectric layer 30' to allow metalization of the top and bottom electrodes. The thickness of contact holes 34 and 32 is the same since they are etched through the same thickness of material. Contact holes 32 and 34 are ideally simultaneously etched in two steps to remove the dielectric oxide material and then the remaining ferroelectric material. The type of etch used in the same as described with reference to FIG. 8. After contact holes 32 and 34 have been etched, an optional third recovery anneal can be performed.

Figure 32:
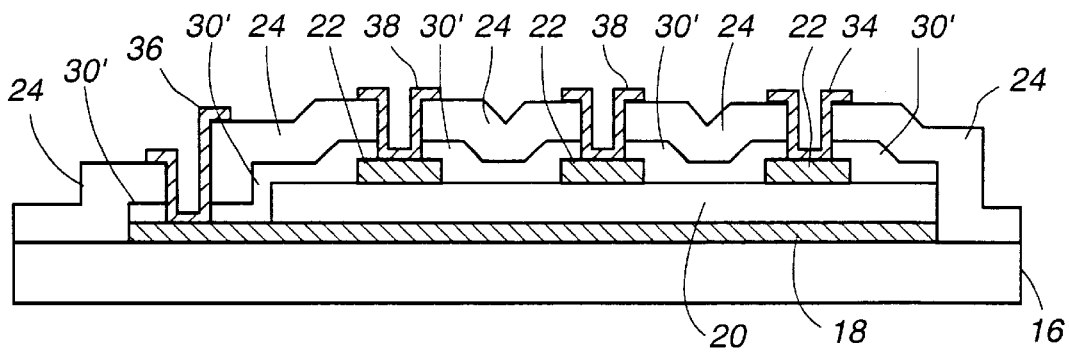

In FIG. 32, contact holes 32 and 34 are metalized to provide electrical access to bottom electrode 18 and top electrodes 22. The full metalization scheme showing subsequent oxide and metalization layers for a ferroelectric memory cell is shown in FIG. 52, although other metalization schemes can be used.

A plan view of the capacitor structure described above with respect to FIGS. 26–32 is not shown, but is similar to the plan view shown in FIG. 18. The one difference is that the second ferroelectric layer 30' does not overlap the bottom electrode 18, but is coincident thereto.

Referring now to FIGS. 33–41, sequential sectional views of a fifth ferroelectric capacitor process suitable for use in a ferroelectric memory having decreased hydrogen sensitivity are shown.

Figure 33:
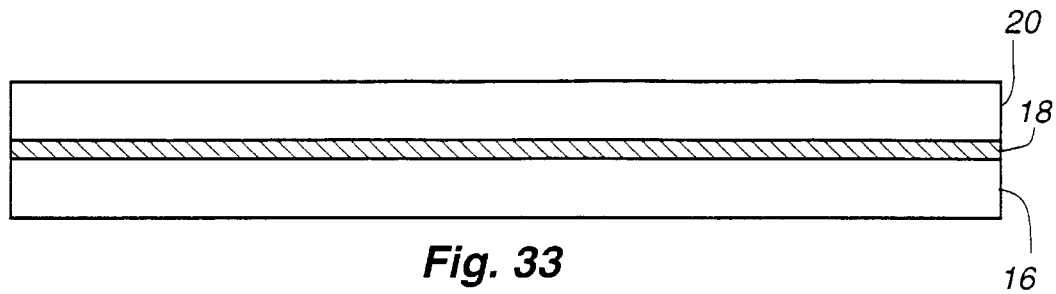
FIGS. 33–41 are sequential sectional views of a ferroelectric capacitor process suitable for use in a ferroelectric memory having decreased hydrogen sensitivity according to a fifth embodiment of the invention.

In FIG. 33, a layer 16 of BPSG glass about 7000 Angstroms thick is deposited onto a silicon or other substrate (not shown). A platinum bottom electrode layer 18 is subsequently deposited over BPSG glass layer 16 to a thickness of about 1750 Angstroms. The bottom electrode layer 18 also includes a titanium adhesion layer about 200 Angstroms thick to facilitate the adhesion of the platinum bottom electrode layer 18 to BPSG glass layer 16. A ferroelectric layer 20 is subsequently deposited over the bottom electrode layer 18 to a thickness of about 3000 Angstroms. The material used in ferroelectric layer 20 is ideally doped or undoped PZT (lead zirconate titanate), SBT (strontium bismuth tantalate), or any other known ferroelectric material suitable for use in thin film form.

Figure 34:
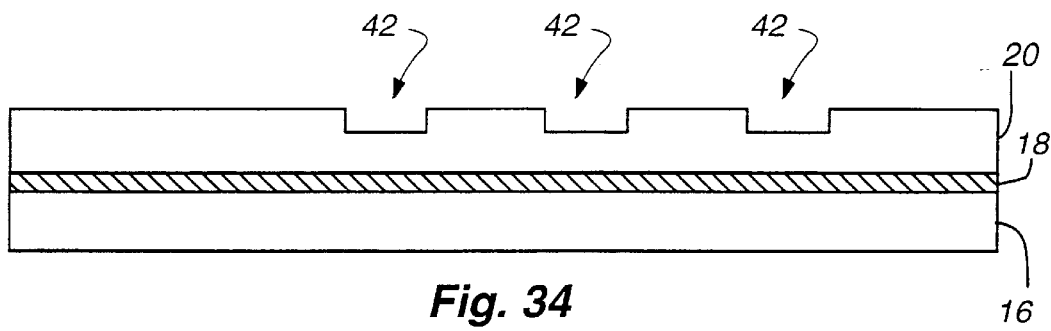

In FIG. 34 the ferroelectric layer 20 is partially etched to form one or more indentations 42. Indentations 42 should be etched to a sufficient depth to completely receive the top electrodes as is explained in further detail below. The etching technique used is the same reactive-ion etch used in etching the ferroelectric layers. After the ferroelectric layer 20 is partially etched, a first anneal is performed. The first anneal includes a 650° C. heat treatment for about five seconds, followed by an 850° C. heat treatment for about five seconds.

Figure 35:
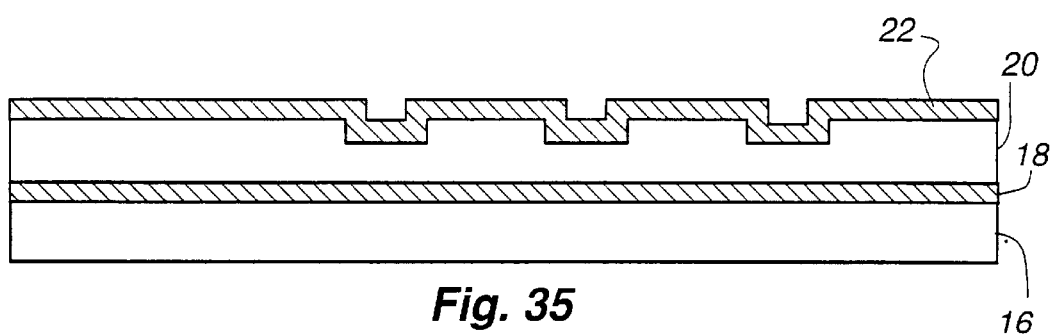

In FIG. 35, a platinum top electrode layer 22 is subsequently deposited over the ferroelectric layer 20 to a thickness of about 1750 Angstroms. The top electrode layer 22 is conformal and thus fills in each of the indentations 42.

Figure 36:
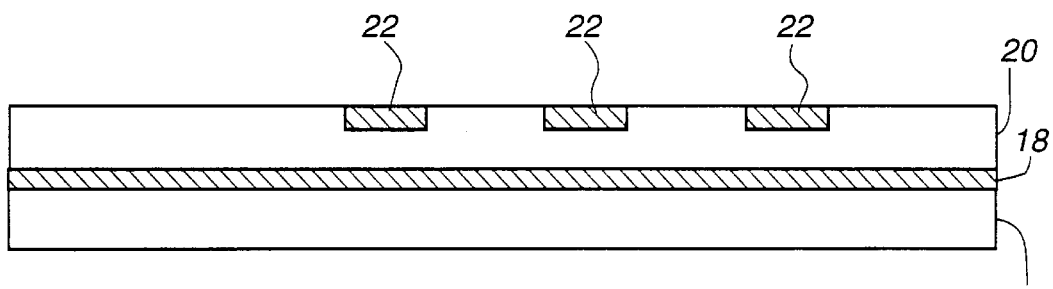

In FIG. 36, the top electrode layer 22 is etched away to form one or more top electrodes in indentations 42. Platinum is typically etched using a reactive-ion etch in an argon and chlorine atmosphere. Alternative etching techniques include ion milling or chemical mechanical polishing (CMP). The dimensions of the individual top electrodes can modified as desired from nominal dimensions of 1.5×1.5 microns, with a spacing of about three microns between top electrodes.

After the platinum top electrode layer 20 is etched to define the individual top electrodes, a second anneal is performed. The second anneal includes a 650° C. heat treatment for about sixty minutes in an oxygen atmosphere.

Figure 37:
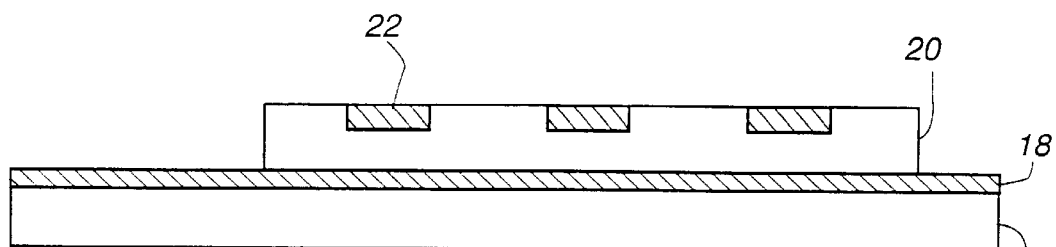

In FIG. 37, the ferroelectric layer 20 is etched to leave a reasonable lateral overlap of the top electrodes 22.

Figure 38:
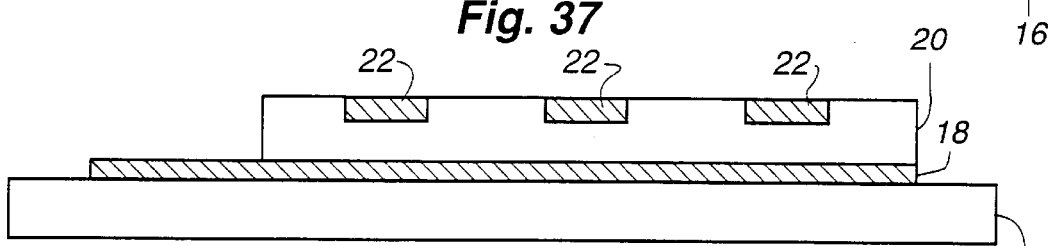

In FIG. 38, the bottom electrode layer 18 is etched to define the dimensions of a bottom electrode. As can be seen in FIG. 38, one end of the bottom electrode 18 is etched to allow room for an eventual bottom electrode contact. The other end of bottom electrode 18 is etched to the same dimensions as the second ferroelectric layer 30. The bottom electrode layer 18 is etched using a reactive-ion etch in an argon and chlorine atmosphere. After the bottom electrode layer 18 is etched, an optional first recovery anneal can be performed. The optional first recovery anneal includes a 550° C. heat treatment for about sixty minutes in an oxygen atmosphere.

Figure 39:
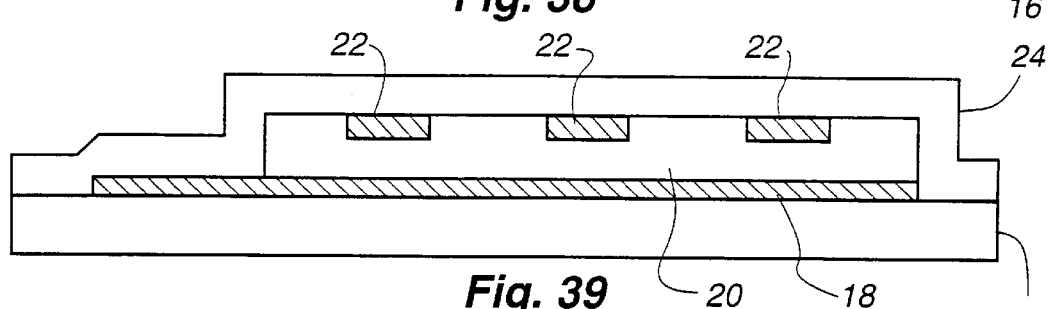

In FIG. 39, a PTEOS glass dielectric layer 24 is deposited over the etched ferroelectric layer 20 to a thickness of about 5000 Angstroms.

Figure 40:
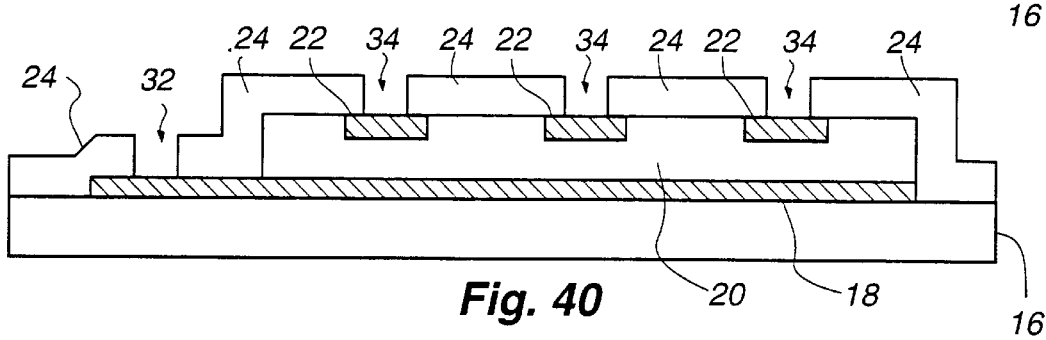

In FIG. 40, contact holes are etched to provide access of the top and bottom electrodes 22 and 18. Contact hole 32 provides access to bottom electrode 18, and contact holes 34 provide access to top electrodes 22. Contact holes 34 and 32 are etched through the dielectric layer 24 to allow metalization of the top electrodes and bottom electrodes 22 and 18. Note that the contact holes 32 and 34 are etched in a single etching step. The dielectric oxide material can be etched away using a fluorine-based wet or dry etch. It is desirable that a sloped profile is etched into the contact holes. Note in FIG. 40 that contact holes 32 and 34 are etched through about the same thickness of material, i.e. 5000 Angstroms of glass dielectric layer 24. A second optional recovery anneal can be performed after contact holes 32 and 34 are opened as previously described.

Figure 41:
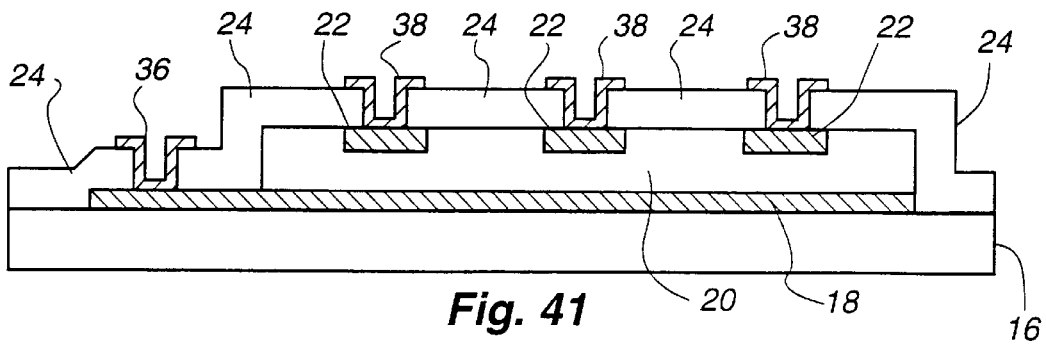

In FIG. 41, contact holes 32 and 34 are metalized to provide electrical access to bottom electrode 18 and top electrodes 22 as previously described above.

A plan view of the capacitor structure described above with respect to FIGS. 33–41 is similar to that shown in FIG. 10. The only difference is that there is no second level of ferroelectric material 30. The contours of the plan view, however, are the same.

Referring now to FIGS. 42–50, sequential sectional views of a sixth ferroelectric capacitor process suitable for use in a ferroelectric memory having decreased hydrogen sensitivity are shown.

Figure 42:
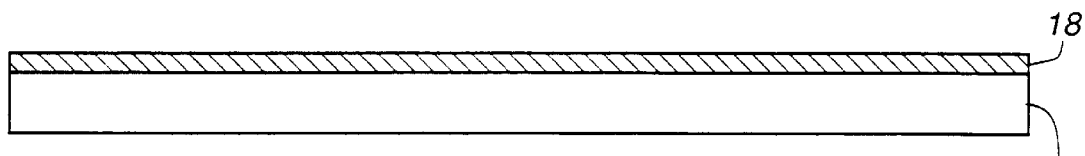
FIGS. 42–50 are sequential sectional views of a ferroelectric capacitor process suitable for use in a ferroelectric memory having decreased hydrogen sensitivity according to a sixth embodiment of the invention.

In FIG. 42, a layer 16 of BPSG glass about 7000 Angstroms thick is deposited onto a silicon or other substrate (not shown). A platinum bottom electrode layer 18 is subsequently deposited over BPSG glass layer 16 to a thickness of about 1750 Angstroms. The bottom electrode layer 18 also includes a titanium adhesion layer about 200 Angstroms thick to facilitate the adhesion of the platinum bottom electrode layer 18 to BPSG glass layer 16.

Figure 43:
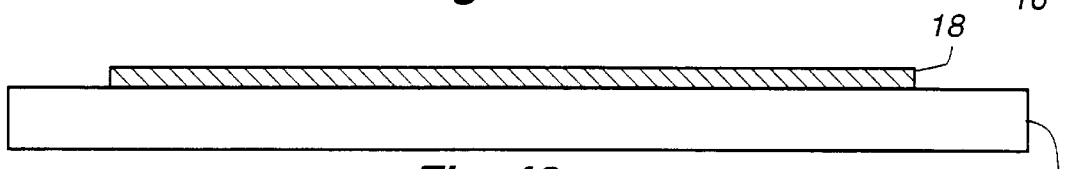

In FIG. 43, bottom electrode layer 18 is etched to form a bottom electrode.

Figure 44:
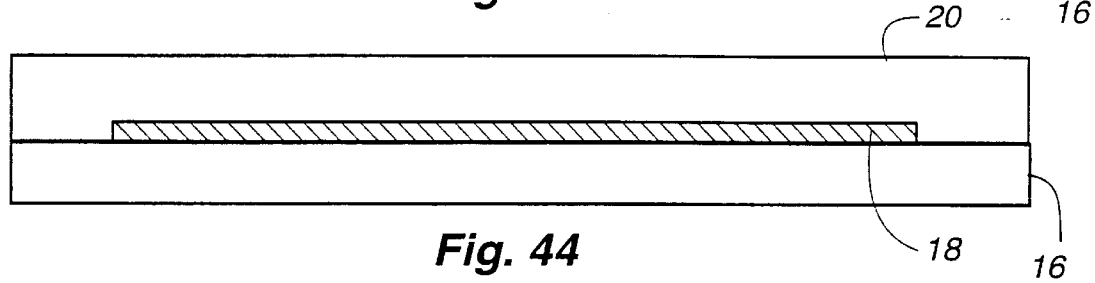

In FIG. 44, A ferroelectric layer 20 is subsequently deposited over the bottom electrode 18 to a thickness of about 3000 Angstroms. The material used in ferroelectric layer 20 is ideally doped or undoped PZT (lead zirconate titanate), SBT (strontium bismuth tantalate), or any other known ferroelectric material suitable for use in thin film form.

Figure 45:
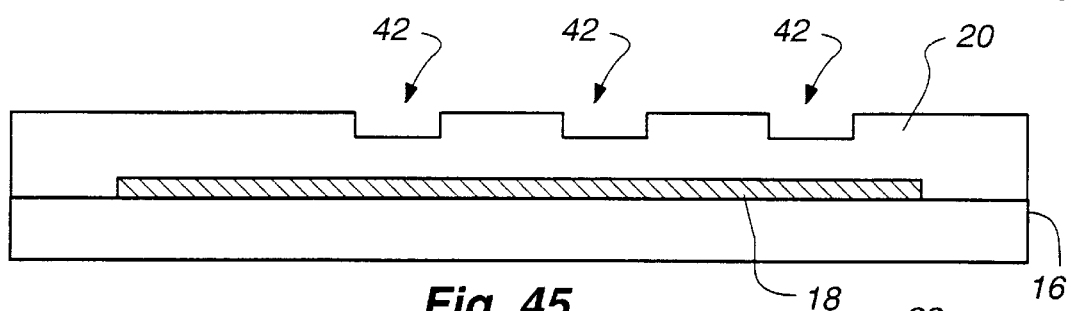

In FIG. 45 the ferroelectric layer 20 is partially etched to form one or more indentations 42. Indentations 42 should be etched to a sufficient depth to completely receive the top electrodes as is explained in further detail below. The etching technique used is the same reactive-ion etch used in etching the ferroelectric layers. After the ferroelectric layer 20 is partially etched, a first anneal is performed. The first anneal includes a 650° C. heat treatment for about five seconds, followed by an 850° C. heat treatment for about five seconds.

Figure 46:
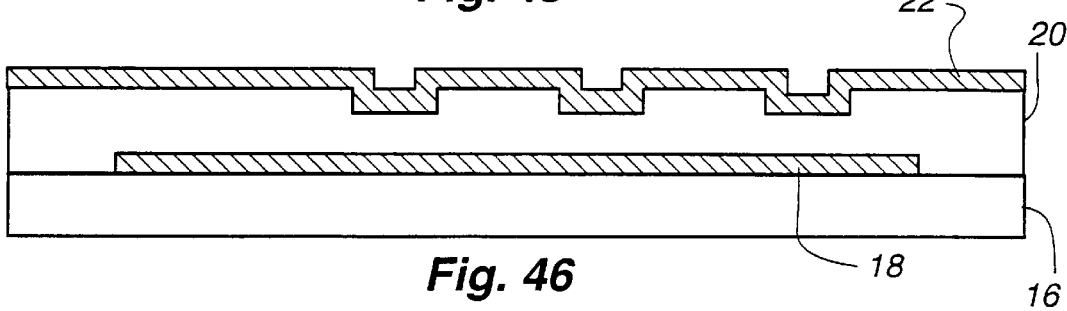

In FIG. 46, a platinum top electrode layer 22 is subsequently deposited over the ferroelectric layer 20 to a thickness of about 1750 Angstroms. The top electrode layer 22 is conformal and thus fills in each of the indentations 42.

Figure 47:
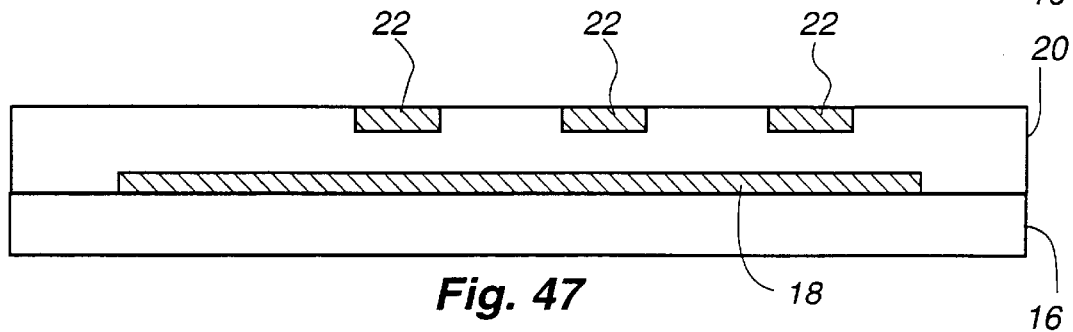

In FIG. 47, the top electrode layer 22 is etched away to form one or more top electrodes in indentations 42. Platinum is typically etched using a reactive-ion etch in an argon and chlorine atmosphere. The dimensions of the individual top electrodes can modified as desired from nominal dimensions of 1.5×1.5 microns, with a spacing of about three microns between top electrodes. After the platinum top electrode layer 20 is etched to define the individual top electrodes, a second anneal is performed. The second anneal includes a 650° C. heat treatment for about sixty minutes in an oxygen atmosphere.

Figure 48:
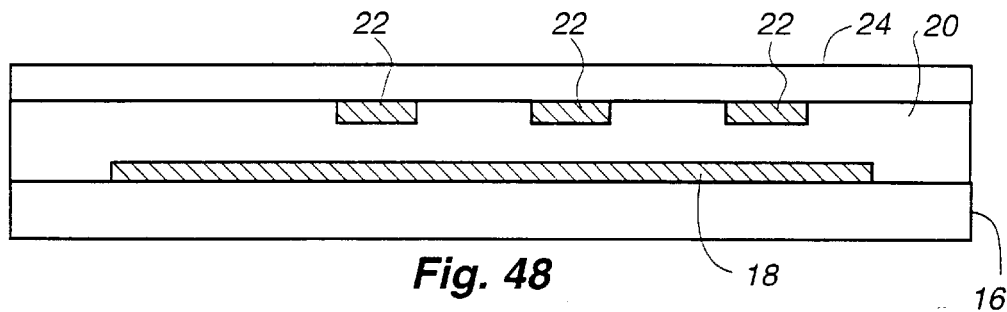

In FIG. 48, a PTEOS glass dielectric layer 24 is deposited over the etched ferroelectric layer 20 to a thickness of about 5000 Angstroms.

Figure 49:
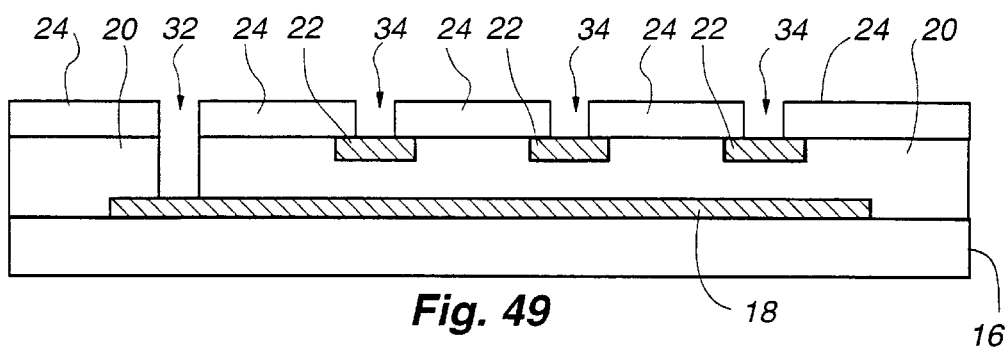

In FIG. 49, contact holes are etched to provide access of the top and bottom electrodes 22 and 18. Contact hole 32 provides access to bottom electrode 18, and contact holes 34 provide access to top electrodes 22. Contact holes 34 are etched through the dielectric layer 24 to allow metalization of the top electrodes 22. Contact hole 32, however is etched through dielectric layer 24 as well as ferroelectric layer 20. Note, therefore, that contact holes 32 and 34 are etched in two separate etching steps. The dielectric oxide material can be etched away using a fluorine-based wet or dry etch. The ferroelectric material is etched used a reactive-ion etch. It is desirable that a sloped profile is etched into the contact holes. An optional recovery anneal can be performed at this point in the process.

Figure 50:
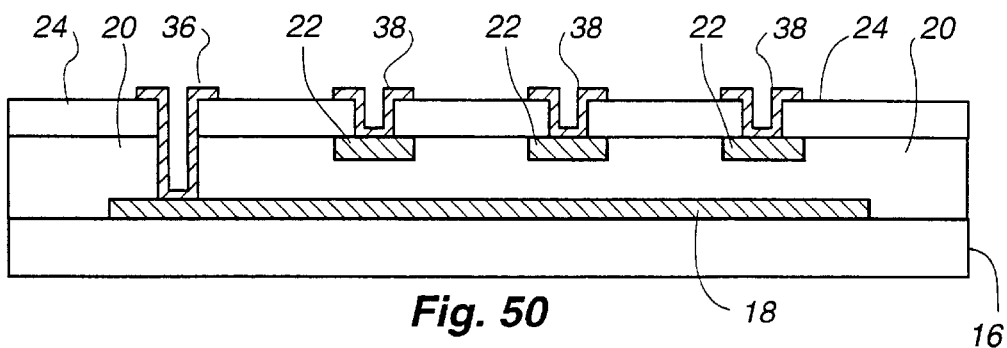

In FIG. 50, contact holes 32 and 34 are metalized to provide electrical access to bottom electrode 18 and top electrodes 22 as previously described above.

A plan view of the capacitor structure described above with respect to FIGS. 42–50 is similar to that shown in FIG. 25. The differences are that there is no second level of ferroelectric material 30, and the contour for ferroelectric material 20 should be removed.

Figure 51:
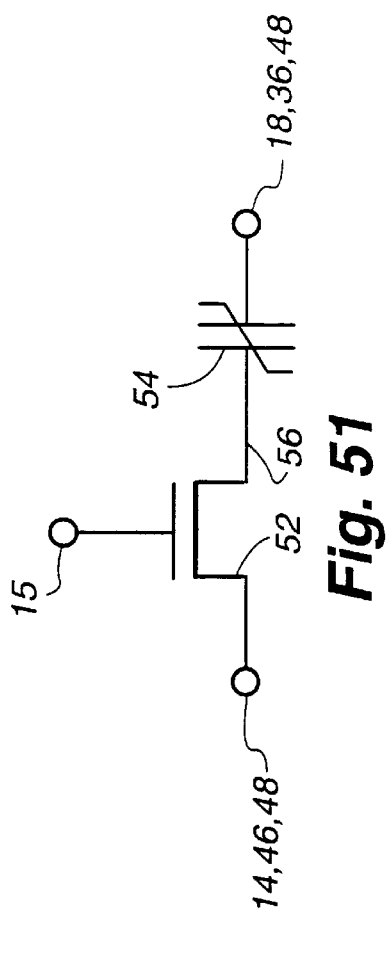
FIG. 51 is a schematic diagram of a ferroelectric memory cell having a transistor and a ferroelectric capacitor.

Referring now to FIG. 51, a schematic diagram for a typical non-volatile ferroelectric memory is shown having a transistor 52 coupled to a ferroelectric capacitor 54. The configuration in FIG. 51 is known as a one-transistor, one-capacitor ferroelectric memory cell or "1T/1C" cell. One current node of the transistor 52 forms the bit line of the cell, and is designated 14, 46, 48 to correspond to regions in the integrated cell shown below in FIG. 52. The other current node of transistor 52 is coupled to ferroelectric capacitor 54 at node 56. The gate 15 of transistor 52 forms the word line of the memory cell. One end of capacitor 54 is coupled to transistor 52 at node 56, and the other end of capacitor 54 forms the plate line of the memory cell. The plate line node is designated 18, 36, 48 to correspond to regions in the integrated cell shown below in FIG. 52.

Referring now to FIG. 52, a sectional view of a completely metalized integrated circuit ferroelectric memory cell having a bit line, a word line, and a late line is shown. The memory cell includes a silicon substrate or epitaxial region 12, and a transistor formed in the substrate 12 including first and second diffused regions 14, a thin gate oxide 13, and a gate 15 forming the word line. A hick oxide layer 16 is formed on the substrate 12 including contact holes to allow metalization of the first and second diffused regions 14. Note that in FIG. 52, the exact sequence for forming each of the various layers and contact holes within each layer is not fully described; the contact holes may actually be formed at a subsequent processing step. A ferroelectric capacitor is subsequently formed on the thick oxide layer 16, including a bottom electrode 18, a ferroelectric layer 20+30, and a top electrode 22, wherein the ferroelectric layer 20+30 either partially or completely encapsulates the top electrode 22. The ferroelectric layer 20+30 includes a contact hole to allow metalization of the top electrode 22.

A first dielectric layer 24 is formed over the thick oxide layer 16 and the ferroelectric capacitor, including contact holes to allow metalization of the first and second diffused regions 14, and the top and bottom electrodes 22 and 18 of the ferroelectric capacitor. A first patterned metalization layer 36, 38, 46 is deposited for contacting the first diffused region 14 with metal contact 46, for forming a local interconnect 38 between the top electrode 22 and the second diffused region 14, and for metalizing the bottom electrode 36 with metal contact 36.

A second dielectric layer 44 is formed over the first metalization layer 36, 38, 46 including contact holes to allow metalization of the first diffused region 14 and the bottom electrode 18. A second patterned metalization layer 48 contacts the first diffused region 14 and forms the bit line of the memory cell, and contacts the bottom electrode 18 to form the plate line of the memory cell. Finally, a passivation layer 50 is formed over the second metalization layer 48.

Although the first and second dielectric layers 24 and 44 are typically thin doped or undoped oxide layers, if greater resistance to hydrogen diffusion is required these layers can also be made of ferroelectric materials such as PZT or SBT. Still further, the passivation layer 50, while typically formed of silicon nitride or the like, can also be made from ferroelectric materials such as PZT or SBT. All three layers mentioned above can be fabricated of the same or different ferroelectric materials as desired, and not necessarily the same material as used in the ferroelectric layer of the ferroelectric capacitor. Further teachings regarding ferroelectric material passivation can be found in U.S. Pat. No. 5,438,023 entitled "Passivation Method and Structure for a Ferroelectric Integrated Circuit using Hard Ceramic Materials or the Like", which is assigned to the assignee of the present invention, Ramtron International Corporation. While extra care can be taken to even further reduce sensitivity to hydrogen, these steps may increase fabrication costs and complexity.

Enhanced-Lead Encapsulation Layer

Improved performance such as increased switched charge resulting from decreased line degradation has been demonstrated using the encapsulation layer as shown and described above. However, it is now known that further improvement is possible by controlling the amount of lead in encapsulation layer 30. Specifically, it is desirable that encapsulation layer 30 contains excess lead (above the amount required to form a standard PZT perovskite structure) so that the amount of lead at the interface between the ferroelectric layer 20 (the capacitor dielectric layer) and the encapsulation layer 30 can be beneficially controlled. It is believed at present that the surface of ferroelectric layer 20 becomes lead-depleted during ferroelectric processing anneals, and that the excess lead in encapsulation layer 30 replenishes the lost lead. Therefore, for optimized performance, it is desirable to carefully control the amount of lead in encapsulation layer 30. No excess lead in layer 30 is not sufficient to restore the lost lead in ferroelectric layer 20; however, too much excess lead in layer 30 can also degrade performance.

A ferroelectric capacitor is shown in FIGS. 11, 19, and 26 and includes a bottom electrode 18, at least one top electrode 22, and a ferroelectric layer 20 located between the top and bottom electrodes 22 and 18. A PZT encapsulation layer 20 is used for completely encapsulating the top electrode, except for a contact hole 34 to allow metalization of the top electrode 22, wherein at least a portion of the PZT encapsulation layer 30 contains excess lead. The PZT encapsulation layer 30 is clearly shown in FIGS. 13, 21, and 28, as well as subsequent drawing figures. While the optimum amount of excess lead will vary according to the exact manufacturing conditions and process used, a PZT encapsulation layer 30 containing between about 5% and 50% excess lead is recommended as a starting, point. In a preferred embodiment of the invention a PZT encapsulation layer 30 was used that contained about 20% excess lead. This amount of lead yielded a significant improvement in ferroelectric memory performance indicia, such as switched charge.

As noted above, the amount of lead at the interface between ferroelectric layer 20 and encapsulation layer 30 is important, since it is believed that the excess lead at this interface is used to replenish the lost lead in layer 20. Therefore, it is desirable that the bottom portion of the PZT encapsulation layer 30 (i.e., closest to ferroelectric layer 20) contains excess lead. In a preferred embodiment of the invention, electrical performance was tested with an encapsulation layer 30 in which the bottommost 300 Angstroms contained the excess lead.

The PZT encapsulation layer 30 is typically about 3000 Angstroms thick, but an encapsulation layer 30 between about 500 and 5000 Angstromst thick can be used. The ferroelectric layer 20 is typically PZT, which becomes lead-depleted within the surface region during processing anneals. Ferroelectric layer 20 is also typically about 2400 to 3000 Angstroms thick, but a layer 20 between about 500 and 5000 Angstroms thick can be used.

In general, the method of fabricating an improved ferroelectric capacitor includes the steps of forming in sequence a bottom electrode layer 18, a ferroelectric layer 20, and a top electrode layer 22; etching the top electrode layer 22 to form a top electrode 22; forming a lead-enhanced PZT encapsulation layer 30 over the ferroelectric layer 20, thereby completely encapsulating the top electrode 22; etching the encapsulation layer 30; and metalizing the top electrode 22 through the etched encapsulation layer 30.

The encapsulation layer 30 is formed via sputtering. The sputtering tool used was a Gryphon Reliance, the ambient sputtering atmosphere was argon, and the deposition was conducted at room temperature. The PZT sputtering target used also contained trace amounts of a lanthanum dopant. The plasma inside the sputtering tool was stabilized with wafers parked outside the deposition zone and then the wafers were subsequently rotated through the plasma at ten RPMs for the time necessary to achieve a film thickness of about 2400–3000 Angstroms.

Deposition times for the first portion of encapsulation layer 30 were from six to twelve minutes depending on the power and pressure used to achieve a thickness of about 300 Angstroms. The deposition times for the second portion of encapsulation layer 30 ranged from 41 minutes to 46 minutes.

The lead content of the encapsulating layer 30 in the first 300 Angstroms of the film was varied between approximately 20% excess lead to 50% excess lead as follows:

| Excess Lead | Pressure | Deposition Power |
|---|---|---|
| 20% | 6 mT pressure | 1000 watts deposition power |
| 30% | 18 mT pressure | 700 watts deposition power |
| 40% | 30 mT pressure | 700 watts deposition power |
| 50% | 42 mT pressure | 700 watts deposition power |

The remainder of the film (i.e. the bulk or second portion) was deposited at 6 mT and 1000 watts of deposition power. The lower lead content (20%) at the interface between ferroelectric layer 20 and encapsulation layer 30 provided the best performing encapsulation in terms of process immunity and improved electrical performance. However, it is believed that other, lower, percentages down to 5% excess lead may also reduce line degradation and lead to an improvement in electrical performance.

Individual process flows obviously incorporate variations in temperature cycling based on selection of backend equipment and processing. Therefore, the amount of actual excess lead used, and the excess-lead profile in encapsulation layer 30 will have to be optimized to each specific process flow.

Potentially, encapsulation with other forms of lead-containing films is possible (e. g. lead titanate, lead oxide, as well as other non-PZT lead-based compounds). However, minimization of the number of sputtering targets required to support the manufacturing flow is desirable. The method of the present invention can be adapted to use CVD ("Chemical Vapor Deposition") processing or even CSD ("Chemical Solution Deposition") if corresponding planarization schemes are incorporated.

Having described and illustrated the principles of the invention in a preferred embodiment thereof, it is appreciated by those having skill in the art that the invention can be modified in arrangement and detail without departing from such principles. For example, the following aspects of the semiconductor processes described herein can be changed as required: the types of dielectric materials; the thicknesses of the various layers; the types of ferroelectric materials; the etching processes; the electrode materials; and the anneal temperatures, durations, and numbers. Also, the specific application of the ferroelectric capacitor of the present invention is not limited to ferroelectric memory cells, although it is ideally suited to that application. We therefore claim all modifications and variation coming within the spirit and scope of the following claims.

We claim:

1. A method of fabricating a ferroelectric capacitor, the method comprising the steps of:
    (a) forming in sequence a bottom electrode layer, a ferroelectric layer, and a top electrode layer;
    (b) etching the top electrode layer to form a top electrode;
    (c) forming a lead-enhanced PZT encapsulation layer over the ferroelectric layer, thereby completely encapsulating the top electrode;
    (d) etching the encapsulation layer; and
    (e) metalizing the top electrode through the etched encapsulation layer.

2. The method of claim 1 in which step (c) comprises the step of forming a PZT encapsulation layer, a portion of which contains between about 5% and 50% excess lead.

3. The method of claim 1 in which step (c) comprises the step of forming a PZT encapsulation layer, a portion of which contains about 20% excess lead.

4. The method of claim 1 in which step (c) comprises the step of forming a PZT encapsulation layer, a bottom portion of which contains excess lead.

5. The method of claim 1 in which step (c) comprises the step of forming a PZT encapsulation layer, a bottommost 300 Angstroms of which contains excess lead.

6. The method of claim 1 in which step (a) comprises the step of forming a PZT ferroelectric layer.

7. The method of claim 1 in which step (a) comprises the step of forming a lead-depleted PZT ferroelectric layer.

8. A method of fabricating a ferroelectric capacitor comprising:
    (a) forming a bottom electrode layer, a ferroelectric layer, and a top electrode layer;
    (b) etching the top electrode layer to form a top electrode; and
    (c) forming a lead-enhanced PZT encapsulation layer over the ferroelectric layer.

9. The method of claim 8 in which forming the encapsulation layer comprises forming a lead-enhanced PZT encapsulation layer in which a bottom portion of the layer contains excess lead.

* * * * *